United States Patent
Tsuneta et al.

(10) Patent No.: US 6,888,139 B2
(45) Date of Patent: May 3, 2005

(54) ELECTRON MICROSCOPE

(75) Inventors: Ruriko Tsuneta, Kokubunji (JP);
Masanari Koguchi, Kunitachi (JP);
Isao Nagaoki, Hitachinaka (JP);
Hiroyuki Kobayashi, Mito (JP)

(73) Assignee: Hitachi, Ltd., Tokyo (JP)

( * ) Notice: Subject to any disclaimer, the term of this patent is extended or adjusted under 35 U.S.C. 154(b) by 149 days.

(21) Appl. No.: 10/402,977

(22) Filed: Apr. 1, 2003

(65) Prior Publication Data

US 2003/0201393 A1 Oct. 30, 2003

Related U.S. Application Data

(63) Continuation of application No. 09/571,976, filed on May 16, 2000, now Pat. No. 6,570,156.

(30) Foreign Application Priority Data

May 19, 1999 (JP) ............................................ 11-138242

(51) Int. Cl.[7] ............................. H01J 37/26; G21K 7/00
(52) U.S. Cl. ................. 250/311; 250/358.1; 250/359.1; 250/361 R; 250/363.07; 250/370.08; 250/396 R; 250/310; 250/347; 250/17 L; 250/397; 250/398; 250/399; 250/400; 250/336.1; 250/362
(58) Field of Search ............................. 250/311, 358.1, 250/359.1, 361 R, 363.07, 370.08, 396 R, 310, 347, 348, 17 L, 397–400, 336.1, 362, 368; 315/382, 31 R; 358/227; 382/31, 54, 43

(56) References Cited

U.S. PATENT DOCUMENTS

| 4,567,369 A | 1/1986 | Smith et al. |
| 4,618,766 A | 10/1986 | Van der Mast et al. |
| 4,619,240 A | 10/1986 | Bedford et al. |
| 4,725,722 A | 2/1988 | Maeda et al. |

(Continued)

FOREIGN PATENT DOCUMENTS

| JP | 10-187993 | 7/1998 |
| JP | 10-339607 | 12/1998 |

OTHER PUBLICATIONS

A.J. Koster, et al., Autotuning of a TEM Using Minimum Electron Dose, *Ultramicroscopy*, vol. 27, 1989, pp. 251–272.

N. Ichise, et al. The Correction of Image Drift for Autotuning of a TEM Using Phase Spectrum, Paper 26–II–1015, *Proceedings of the 51st Academic Conference of the Japanese Society for Electron Microscopy*, May 24–26, 1995, p. 161 (in Japanese), including English abstract published in *Journal of Electron Microscopy*, vol. 44, No. 4, 1995, pp. 253.

N. Ichise, et al., The phase spectrum–based measurement of the TEM parameters, *Ultramicroscopy*, vol. 68, No. 3, Jul. 1997, pp. 181–200.

*Primary Examiner*—John R. Lee
*Assistant Examiner*—Bernard Souw
(74) *Attorney, Agent, or Firm*—Antonelli, Terry, Stout & Kraus, LLP

(57) ABSTRACT

The present invention provides an analysis of displacement by calculating the phase variance image P' (k, l) between Fourier transformed images of paired images S1 (n, m) and S2 (n, m) to determine the center of gravity of δ peak appearing on the invert Fourier transform image of the images. The present invention provides numerous advantages such as a precision of displacement analysis of a fraction of pixel to thereby allow to improve the precision of focal analysis, or reduced number of pixels required to achieve the same precision, evaluation of reliability of the analysis by using the δ peak intensity, influence of varying background reduced by using a phase variance component. The improved performance by the present invention allows any operator skilled or not to achieve a best focusing.

4 Claims, 25 Drawing Sheets

U.S. PATENT DOCUMENTS

| | | |
|---|---|---|
| 4,990,776 A | 2/1991 | Fushimi et al. |
| 4,999,635 A | 3/1991 | Niho |
| 5,051,585 A | 9/1991 | Koshishiba et al. |
| 5,081,354 A | 1/1992 | Ohhashi et al. |
| 5,134,288 A | 7/1992 | Van Dijck |
| 5,144,129 A | 9/1992 | Kobayashi et al. |
| 5,148,502 A | 9/1992 | Tsujiuchi et al. |
| 5,233,192 A | 8/1993 | De Jong et al. |
| 5,300,776 A | 4/1994 | Krivanek |
| 5,523,576 A * | 6/1996 | Koike et al. .............. 250/491.1 |
| 6,067,164 A | 5/2000 | Onoguchi et al. |
| 6,448,555 B1 * | 9/2002 | Hosokawa ................... 250/310 |
| 6,570,156 B1 * | 5/2003 | Tsuneta et al. ............. 250/311 |
| 2002/0117635 A1 * | 8/2002 | Shinada et al. ........... 250/492.3 |
| 2003/0111602 A1 * | 6/2003 | Sato et al. ................... 250/310 |
| 2003/0127593 A1 * | 7/2003 | Shinada et al. ............. 250/310 |
| 2003/0141451 A1 * | 7/2003 | Sato et al. ................... 250/310 |
| 2003/0164460 A1 * | 9/2003 | Shinada et al. ........... 250/492.3 |
| 2003/0201393 A1 * | 10/2003 | Tsuneta et al. ............. 250/311 |

* cited by examiner

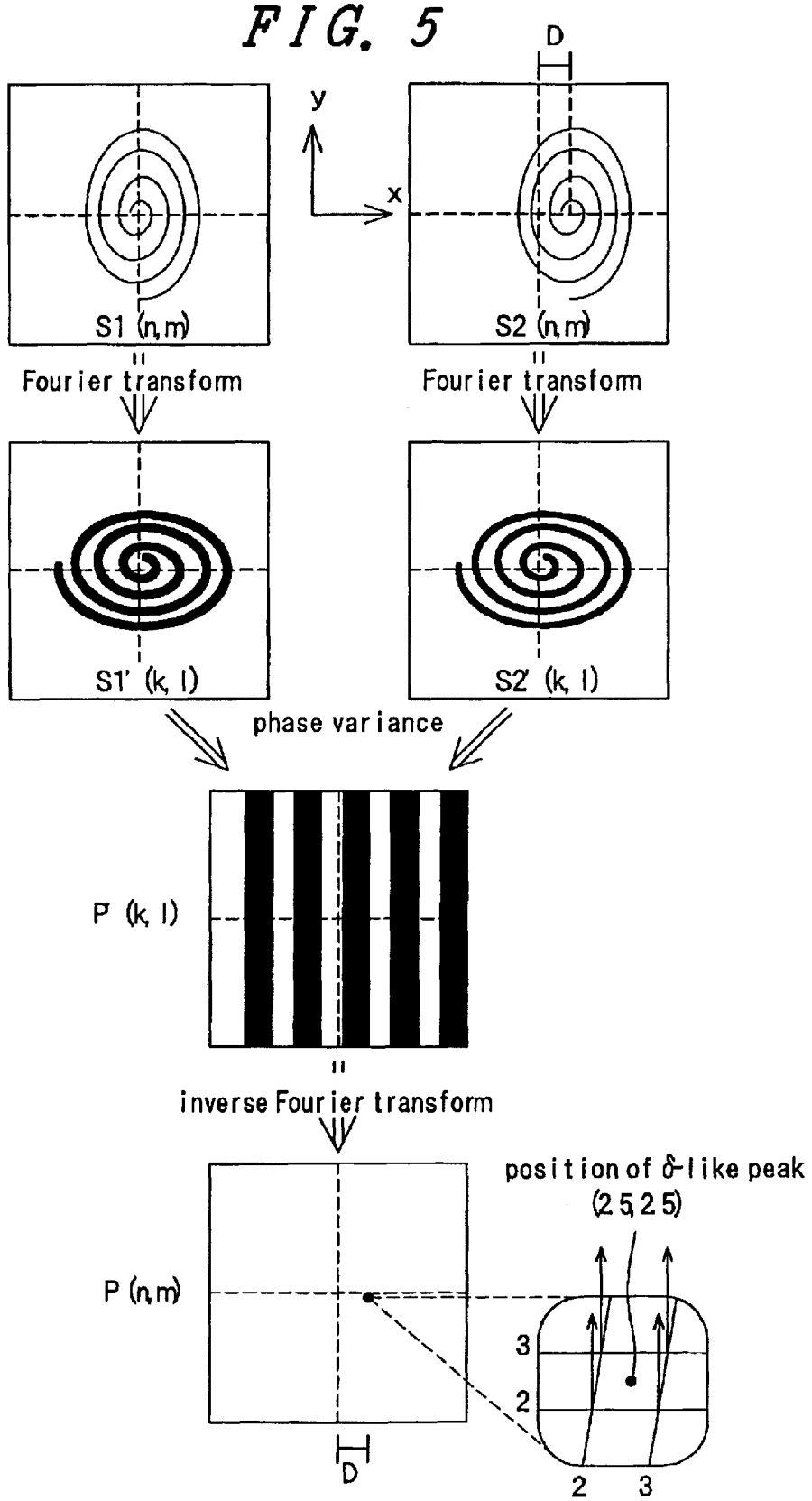

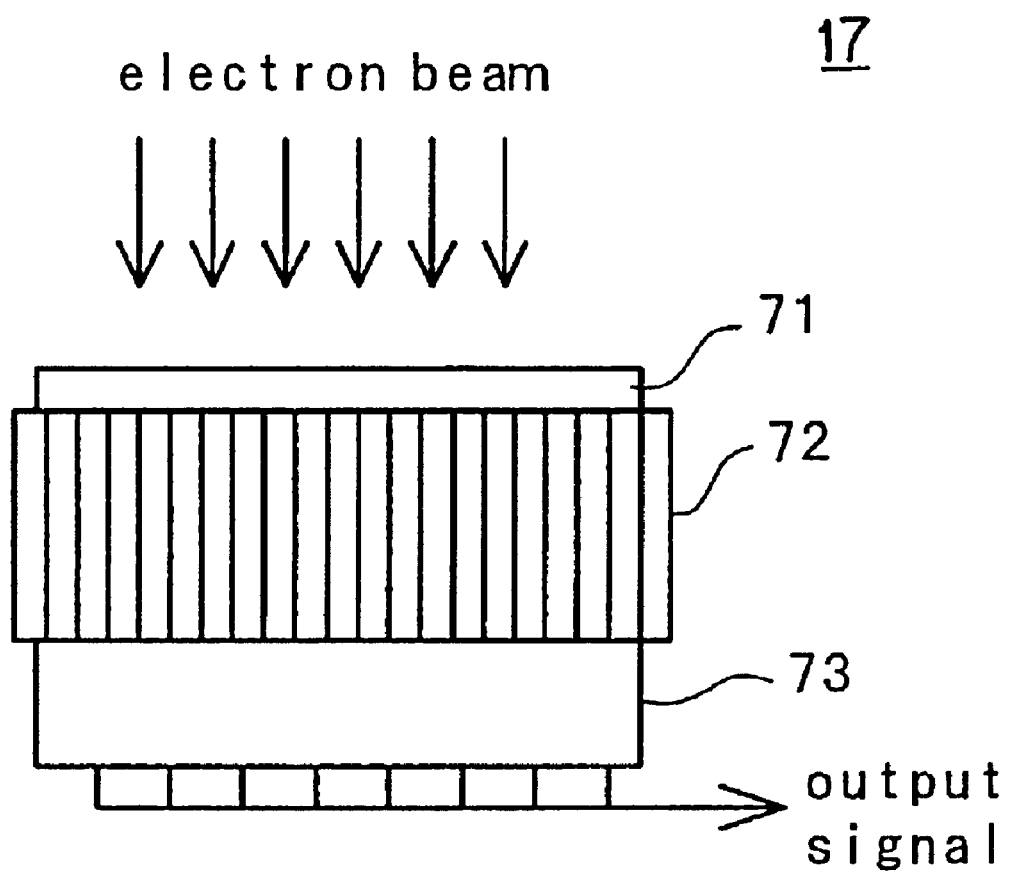

virus

TEM image no virus

TEM image result of virus inspection distribution of Z position distribution value of correlation value TEM image of a specimen TEM image without specimen clipped field    defects

FIG. 24
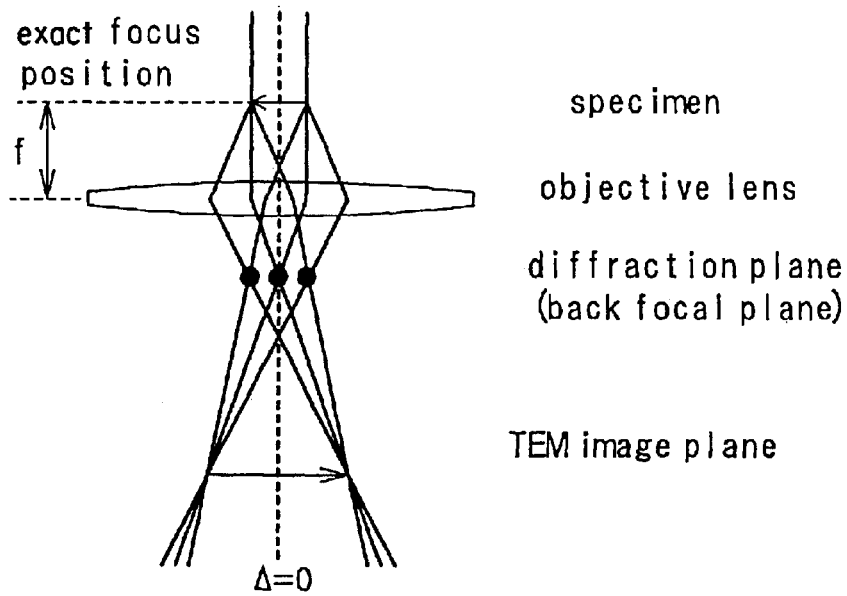
(a) no tilted beam ($\alpha = 0$), exact focus ($F = 0$)
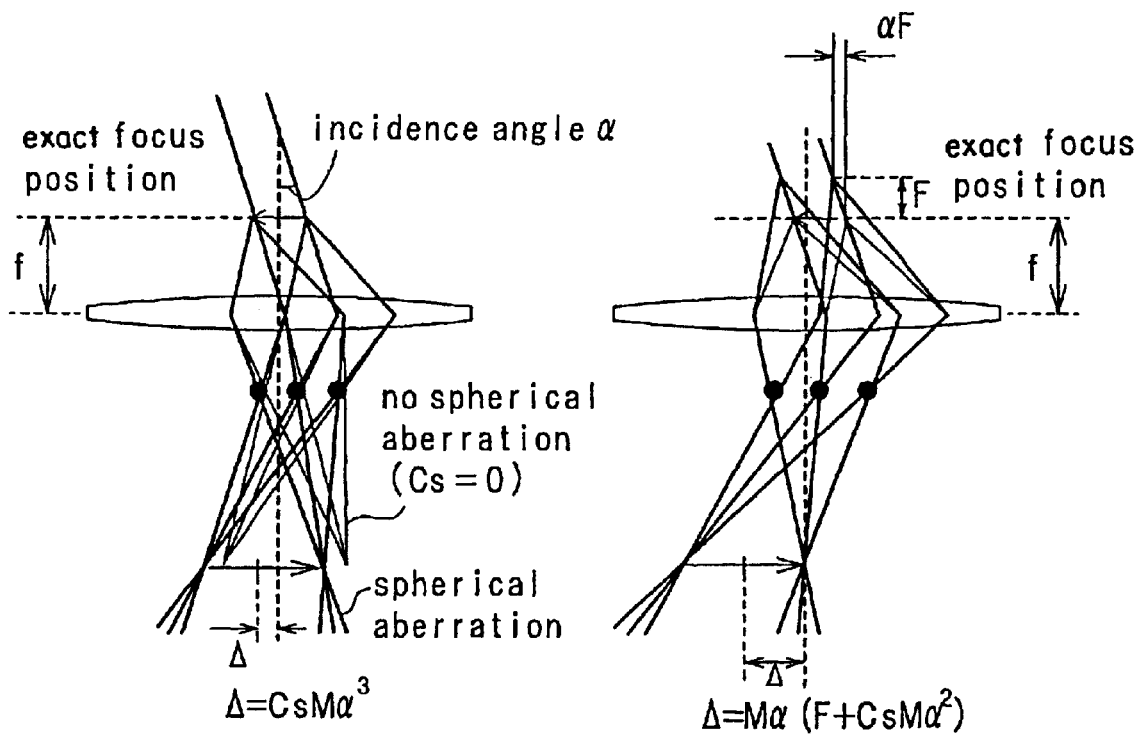
(b) tilted beam ($\alpha \neq 0$), exact focus ($F = 0$)
$\Delta = CsM\alpha^3$
(c) tilted beam ($\alpha \neq 0$), defocus ($F \neq 0$)
$\Delta = M\alpha(F + Cs M\alpha^2)$

ELECTRON MICROSCOPE

CROSS REFERENCE TO RELATED APPLICATION

This is a continuation of U.S. application Ser. No. 09/571,976, filed May 16, 2000, recently issued as U.S. Pat. No. 6,570,156, the subject matter of which is incorporated by reference herein.

BACKGROUND OF THE INVENTION

1. Field of the Invention

The present invention relates to an apparatus for automatically compensating for the focus and the amount of displacement using an electron microscope image.

2. Description of the Prior Art

The inventor of the present invention have searched the Prior Art with respect to apparatuses for compensating for the focus and the amount of displacement by determining whether or not to automatically compensate therefor by using an electron microscope image, or methods for compensating for the amount of displacement of a continuously moving specimen stage. As the result of search, there have been found three relevant topics. First, a paper entitled as "The correction of image drift for autotuning a TEM using phase spectrum" by Norihiko Ichise et al., disclosed in the proceedings of the 51st academic conference of Japan Electron Microscope Association, May 1995, pp. 161, discloses a method for analyzing and compensating for the influence of image drift by using the phase spectrum method for analyzing the focus, astigmatism, and shifted axis. However, this paper does not disclose anything about the improvement of the precision of analysis by means of the computation of the gravity center of a peak, and determination by means of compensation values, as well as about the compensation of the focus and drift of a continuously moving specimen stage. Second, the Japanese Unexamined Patent Publication No. Hei 10-187993, discloses an apparatus for analysis of displacement between images by using the phase variance of Fourier transform images on two photos taken in different conditions.

However, this application does not disclose anything about the feedback to an electron microscopy apparatus and the spirit of the art but only the measurement of shape and distance of an object from a mark attached to the object. Third, the Japanese Unexamined Patent Publication No. Hei 10-339607, discloses the detection of amount of displacement by image processing of the parallax of electron microscopy images, and the feedback of the result thereof to the electron microscopy apparatus. More specifically, the images do not move before and after the angle of incidence of electron beam varies if a specimen is located just on the focus plane, however, if the specimen is located out of focusing plane then the images move before and after the angle of incidence of electron beam. The relationship between the displacement D and out-of-focus F is D=M α (F+Cs α²), where a designates to the deflection angle of incident electron beam, M to the magnification rate, Cs to the coefficient of spherical aberration, therefore the out-of-focus F may be given if the parallax displacement D is determined. There is disclosed an apparatus for compensating for the focusing of objective lens system by storing on a memory a pair of images before and after altering the incident angle to apply a cross-correlation method or least-squares estimation method to analyze the displacement D to determine the amount of defocus F. However, the analysis method of displacement using the phase variance of Fourier transform images is not disclosed. In an apparatus for automatically compensating for the focusing or the amount of displacement by using electron microscopy images, the performance may depend on the settings of the photographic condition of images, analyzing images, and feeding back the analysis results. However, the optimization is not performed with respect to the object, precision and time of compensation.

The performance of the apparatus for automatic focusing an electron microscope in accordance with the displacement D between electron microscopy images such as the focus analysis using parallax and the like may depend largely on the analysis method of displacement D. The analysis methods of displacement used heretofore, such as for example the cross-correlation method, least-squares method and the like, were limited in terms of the precision by size of pixels of the electron beam detector. The length of a side of pixel of a CCD camera used for present electron microscopy imaging is approximately 25 microns. The amount of defocus F corresponding to a pixel may depend on the angle and magnitude of incident electron beam, the variance of incident angle α may be approximately at most 0.5° due to the limitation by the hole diameter of objective aperture, and the magnitude should be the actual observation magnitude. For example, at a magnification of 5,000, and an incident angle variance of 0.5°, the focusing distance corresponding to the displacement D of a pixel is approximately 0.6 microns. This value is less than the precision level of focus compensation by a skilled operator. The improvement of performance of apparatus such as refining the images used by the displacement analysis in favor of improving the precision in the focusing analysis may cause excessive time spent for analysis and excessive cost of hardware, thus is not practical.

The conventional method of displacement analysis has no functionality of numerical verification on whether or not an analysis has been performed correctly, so that the operator had to guess the result by the eye. Otherwise the operator had to compensate for the focusing based on thus obtained analysis results to verify that the compensation was done accurately. Since the automatic compensator has not assurance enough to correctly perform any analysis, there may be a need for a functionality of aborting compensation when the result of analysis is not highly reliable.

Furthermore, in the analysis of displacement in the prior art the analysis was almost impossible when the image was shadowed by the objective aperture. This phenomenon may be encountered routinely in the TEM observation, malfunction thereby thus may cause problems in practice.

SUMMARY OF THE INVENTION

An object of the present invention is to provide an apparatus for automatic compensation by determining whether or not the focusing or the amount of movement is to be automatically compensated for by using electron microscope images.

The present invention uses the analysis method for determining the displacement of electron microscope images as will be described below.

For a pair of images containing displacement, a deflector means for deflecting the incident angle to first electron microscope specimen is used to obtain a pair of images, to perform a Fourier transform thereon to compute the phase variant images. The analysis images obtained by having an invert Fourier transform or Fourier transform applied on the phase variant images may contain δ peaks at the positions corresponding to the displacement. The analysis images may be assumed to contain only the δ peaks, so that any peaks other than δ may be treated as noise component.

Therefore, the computation of the gravity center of δ peaks will result in an accurate position of the peaks even when the positions of δ peaks contains fractional component. The intensity of δ peaks computed after normalizing the intensity of analysis images may be used as a correlation, which indicates a match between images.

BRIEF DESCRIPTION OF THE DRAWINGS

The accompanying drawings, which are incorporated in and constitute a part of this specification illustrate embodiments of the invention and, together with the description, serve to explain the objects, advantages and principles of the invention.

In the drawings,

FIG. 5 shows a schematic diagram illustrating the computation of displacement;

FIG. 6 shows a schematic diagram of basic configuration of an electron detector 17 for TEM;

FIG. 24 shows a schematic diagram illustrating the principal of the method of focus analysis using the parallax, (a) when irradiating a specimen with an electron beam in parallel at the focal position, (b) when irradiating diagonally a specimen with an electron beam at the focal position, (c) when irradiating diagonally an electron beam to a specimen at the position out of focus;

DETAILED DESCRIPTION OF THE PREFERRED EMBODIMENTS

A detailed description of preferred embodiments embodying the present invention will now be given referring to the accompanying drawings.

[First Embodiment]

Figure 19:
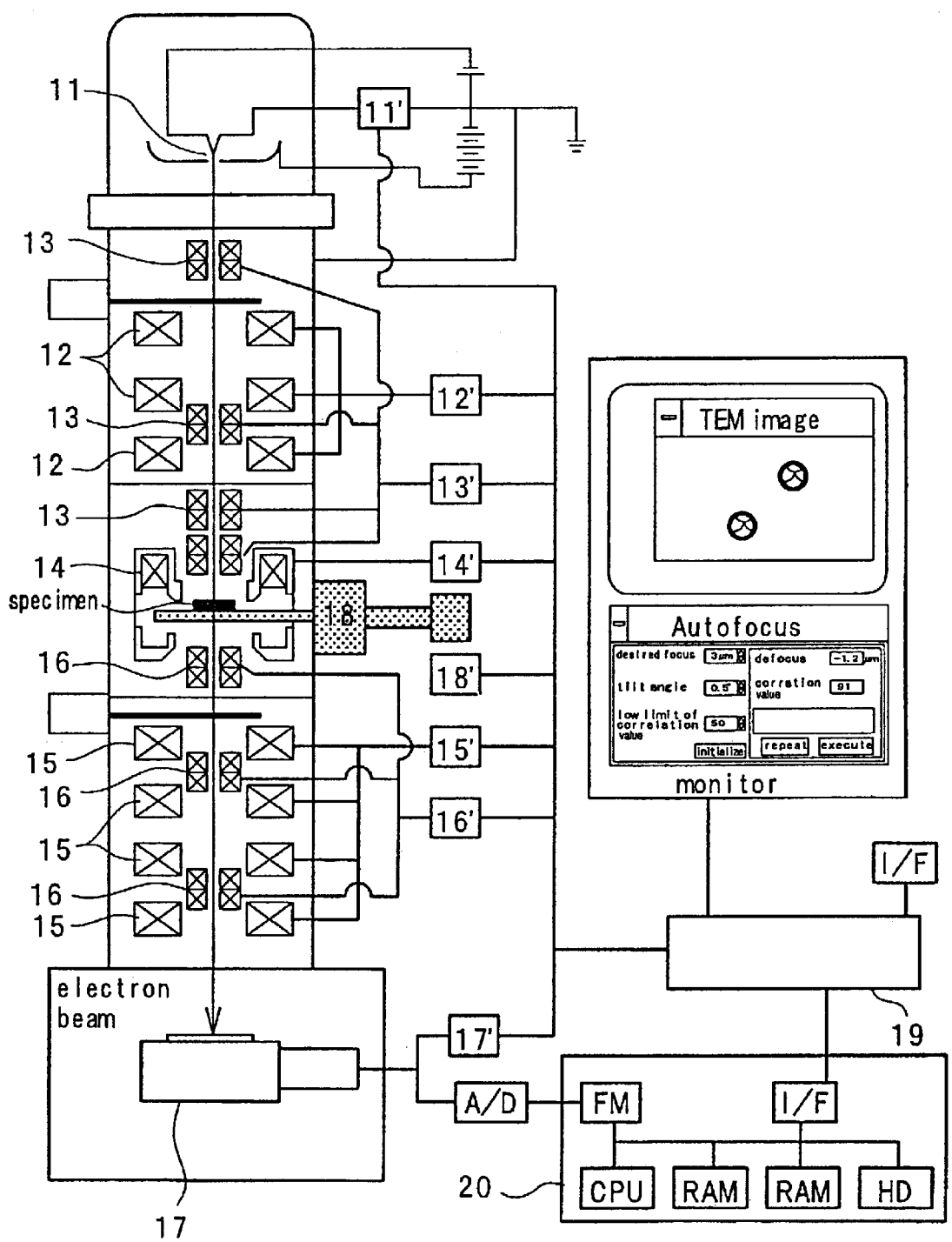
FIG. 19 shows an electron microscope in accordance with the present invention.

FIG. 19 shows an transmission electron microscope (referred to and abbreviated to as TEM hereinafter) used in the embodiments disclosed herein in accordance with the present invention.

The TEM comprises an electron gun 11 and electron gun control circuit 11', a condenser lens 12 and condenser lens control circuit 12', a deflective coil for condenser system 13 and deflective coil control circuit for condenser system 13', an objective lens 14 and objective lens control circuit 14', a projector lens 15 and projector lens control circuit 15', a deflective coil for condenser system 16 and deflective coil control circuit for condenser system 16', an electron detector 17 and electron detector control circuit 17', a specimen stage 18 and specimen stage control circuit 18', a computer with control software and image processing software 19. Each of control circuits may receive control commands sent from the control software in the computer 19, perform controls and return the return value to the computer. The electron detector 17 is a detector constituted of a plurality of pixels such as a CCD camera, which may transmit signals of obtained images through the cable for image transmission to the storage device of the computer 19 or to the displacement analysis processor using phase variance of Fourier transform images 20. The displacement analysis processor using phase variance of Fourier transform images 20 is connected to the computer with control software and image processing software 19.

Figure 3:
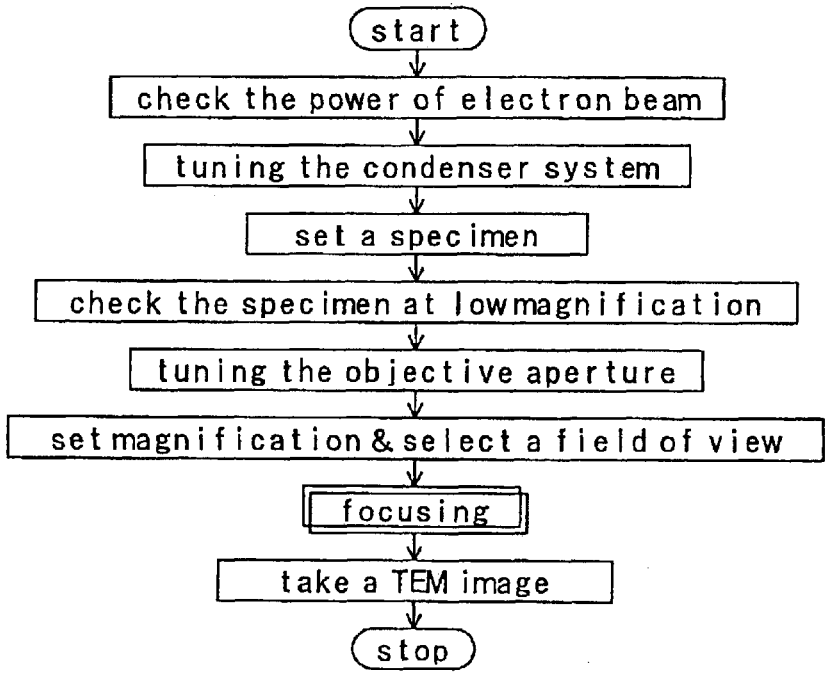
FIG. 3 shows a flow chart of TEM imaging processes.

FIG. 3 shows a flow chart of TEM imaging. An acceleration voltage is applied to the electron beam that is the first charged particle beam generated by the electron gun 11, then the deflective coil for condenser system 13 as a deflector means is used for adjusting the deflection of beam such that the electron beam passes through the optical axis, to verify that the electron beam reaches to the electron detector 17. In this document 'z' axis is defined as an axis in parallel to the optical axis, x-y plane is defined as the plane normal to the optical axis. After adjusting the condenser lens 12, a specimen 21 is set into the TEM, and a TEM image at lower magnification rate is observed. The objective aperture is inserted to the optical axis in order to increase the contrast of TEM image. By gradually increasing the magnification of the projector lens 15, an observation field is selected and the focusing is adjusted to take an image of a second charged particle beam that is an electron beam transmitted through the specimen by the electron detector 17.

Figure 1:
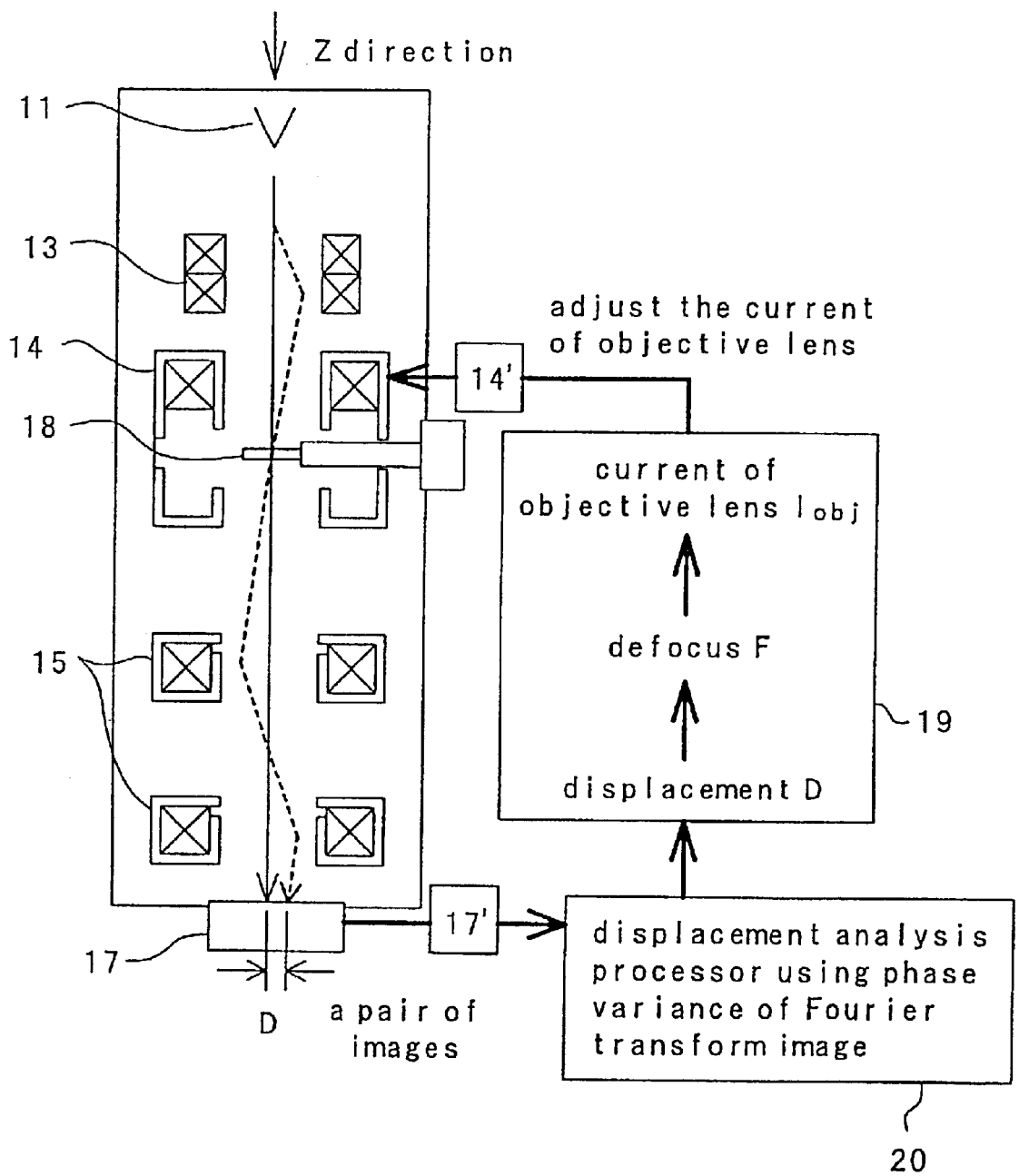
FIG. 1 shows a schematic block diagram of an automatic focusing method using parallax.
Figure 4:
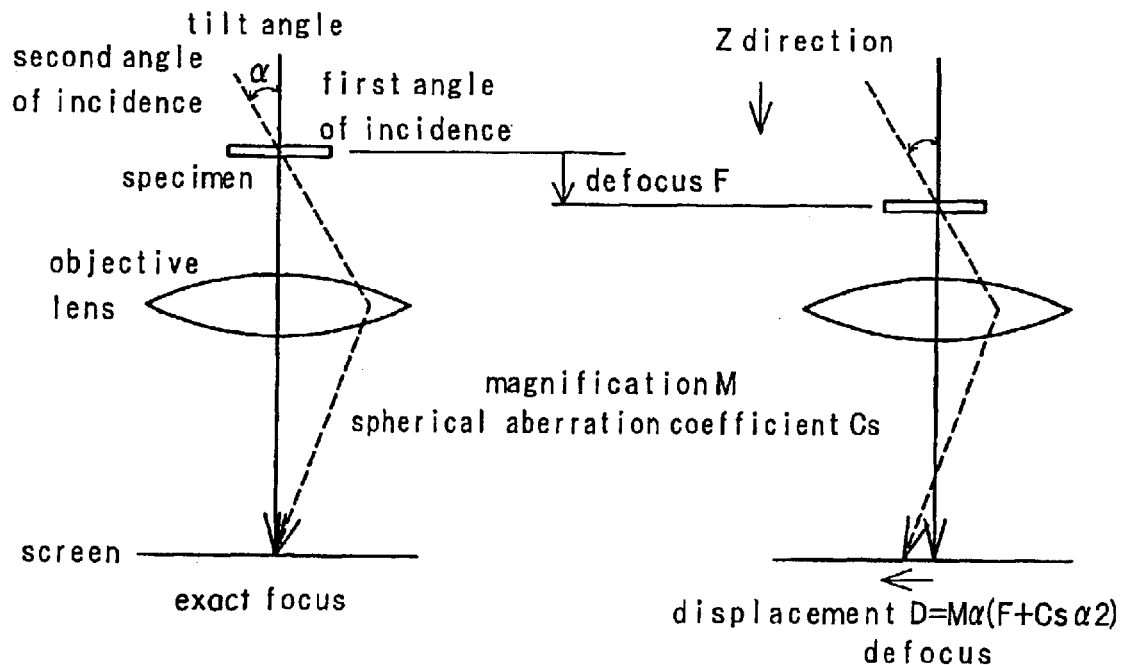
FIG. 4 shows a schematic diagram illustrating the principal of focusing method using parallax.

To the analysis of focusing in the above focusing step is applied a focusing analysis method using parallax. In this method a first TEM image obtained by an electron beam emitted at first incident angle in almost parallel to the optical axis, and a second TEM image obtained by an electron beam emitted at second incident angle descend to an angle $\alpha$ from the optical axis are used. As shown in FIG. 4, when the beam is focused somewhere out of focus, there will be generated some displacement between the first TEM image and second TEM image. The defocus F is correlated with displacement D by parallax in the relationship given by $D=M \alpha (F+Cs \alpha^2)$ The magnification rate M and the angle $\alpha$ may be set by the operator. Since the coefficient of spherical aberration Cs is intrinsic to a specific apparatus, the amount of defocusing F may be specified by determining the displacement D of the image pair. The present invention is characterized in that an analysis method based on the phase variant analysis of Fourier transform images is applied to the determination of displacement D. As shown in FIG. 1, first and second TEM images may be obtained by using the electron detector 17, with the angle of incidence of electron beam with respect to the specimen being varied by using the deflective coil for condenser system 13 mounted above the objective lens 14. The first and second TEM images thus obtained will be sent to the displacement analysis processor using phase variance of Fourier transform images 20, from which the displacement D will be further sent to the computer with control software and image processing software 19. The computer 19 will compute the amount of defocus F from the displacement D to determine the current of objective lens $I_{obj}$ required for adjusting the focusing, and finally the focus of the objective lens 14 will be thereby compensated for.

FIG. 5 shows a schematic diagram illustrating the computation of displacement using the phase component of Fourier transform. For a pair of images with a displacement D=(dx, dy), by assuming S1 (n, m)=S2 (n+dx, m+dy) the two dimensional discrete Fourier transform of S1 (n, m) and S2 (n, m) will be S1' (k, l), and S2' (k, l).

In accordance with the formula F {S (n+dx, m+dy))=F }S (n, m)} exp (idxk+idyl) of the Fourier transform, S1' (k, l)=S2' (k, l) exp (idxk+idyl) maybe obtained. The displacement in S1' (k, l) and S2' (k, l) above may be expressed as the phase variance exp (idxk+idyl)=P' (k, l). Since P' (k, l) is a wave with the cycle (dx, dy), then in an image P (n, m) which is subjected to invert Fourier transform of a phase variant image P' (k, l), a $\delta$ peak will be appeared at the location (dx, dy). If (dx, dy) have a fraction, for example (dx, dy)=(2.5, 2.5), then the intensity of $\delta$ peak will be distributed in a manner aliquot to (2, 2), (2, 3), (3, 2), and (3, 3). Since it can be assumed that in the image P (n, m) only the $\delta$ peak may be present, the computation of four gravity centers of intensity of pixels allows the correct determination of $\delta$ peak even if a fraction is present. The cross-correlation method, which is used in the Prior Art as an analysis method, uses |S1'| and |S2'| as analysis images to compute the displacement based on the location with the maximum value in the images. Since the analysis images contains, together with information with respect to the displacement, any image intensity, i.e., the information about amplitude, the precision of analysis will not be improved by the computation of the gravity center. It should be noted here that, when the information on amplitude is not totally eliminated, if an image is computed with the amplitude component suppressed by performing log or $\sqrt{}$ on the amplitude component of S1' (k, l)·S2' (k, l)*=|S1'| |S2'| exp (idxk+idyl) and then with the invert Fourier transform applied, a $\delta$ peak will be appeared at the position (dx, dy) of displacement vector, the analysis of displacement may be performed based on the image. Also it should be noted that a $\delta$ peak will be appeared at the position (-dx, -dy) if the phase variant image P' (k, l) is Fourier transformed, so that the analysis of displacement may be performed on the Fourier transformed image of the phase variant image P' (k, l). Furthermore, any one of other orthogonal transformations may be used instead of Fourier transform to compute an image with peak corresponding to the displacement.

The analysis of displacement may be allowed if common component is present sufficiently in S1 (n, m) and S2 (n, m) when the variance in S1 (n, m) and S2 (n, m) includes not only the displacement but also the variable noise component or background behaviors, or when the image is deformed more or less due to the change of angle of incidence of electron beam. In such a case any peaks other than $\delta$ peak may be treated as noises. When the peak intensity $\delta$ is computed after normalizing the intensity of the entire image P (n, m), the intensity will be weaken if the unmatched area in the pair of images is larger, in other words, if the noise increases. Since the peak intensity will be stronger if the images in the pair match in a larger extent, whereas the intensity will be weaker if the images match in a smaller extent, the operator may identify the signal noise ratio, namely the reliability of results of analysis by expressing the peak intensity as the correlation value indicating the match between images in the pair. In addition, malfunction may be prevented by setting the lower threshold value of the correlation to cause the adjustment of objective lens not to be performed in case in which computed correlation value is less than the lower threshold value.

The analysis of displacement as described above has further an advantage that it is hardly affected by the variance in the background since it uses the phase component of images. In the Prior Art, image analysis may not be allowed if there is any variance in the background due to for example the distribution of intensity of irradiation current, while the analysis of displacement in accordance with the present invention may be allowed in the same condition. Also, the image analysis may not be allowed in the conventional analysis methods if the image contains for example the shadow of objective aperture, the analysis of displacement in accordance with the present invention may be allowed if the common area of the pair of images is sufficiently presented even when the shadow of objective aperture is contained in some extent. As it is anticipated that a user not skilled in the TEM operation may use the automatic focusing apparatus, it may be important that the TEM auto-focus works even when the fine adjustment of TEM is somewhat incomplete.

In order to perform the analysis of displacement, TEM images may be captured by the electron detector 17 such as a CCD camera. The signal detected by the electron detector 17 is amplified by an amplifier, then quantized to send to the computer 19 or the displacement analysis processor using phase variance of Fourier transform images 20. It should be noted that it is important to appropriately set the gain and offset of the amplifier, otherwise almost all characteristics contained in the images will be eliminated in the course of quantization. The electron detector 17 comprises a functionality of automatic adjustment of gain and offset of the detector amplifier by computing the mean intensity value and dispersion of images so as to settle to specified values. Because it is anticipated that the specified mean and dispersion may not be obtained by the gain and offset used, the detector comprises another functionality which may warn the operator when the contrast adjustment is not complete to ask for further adjustments such as redefining the viewing field or tuning of TEM itself.

FIG. 6 shows a schematic diagram of basic configuration of an electron detector 17 for TEM. The electron detector 17 comprises a scintillator 71, a photo coupler 72, and a CCD camera 73. The electrons emitted to the scintillator 71 generate photons. Thus generated photons will pass through the photo coupler 72, which is made of a plurality of bundled optical fibers, to the CCD camera 73 with positional information being held. The CCD camera 73 is constituted of a two dimensional array of a plurality of pixels. The charge generated by the photons incoming to the CCD camera 73 will be stored in each pixel. The stored charge will be read out as the output signal from each pixel. The gain of each pixel, in other words the intensity of signal output delivered by one incident electron may be determined by the light emitting efficiency of the scintillator 71, transmission efficiency of the photo coupler 72, and the quantization efficiency of the CCD camera 73. Because these constants are not uniform from one pixel to another, a fixed pattern is preformed in the electron detector 17.

The image captured by the electron detector 17 with a fixed pattern may store a first contrast corresponding to the specimen structure together with a second contrast corresponding to the fixed pattern of the electron detector 17. When applying the analysis of displacement to the image captured by the electron detector 17 with a fixed pattern, the first contrast corresponding to the structure of specimen may move between paired images S1 (n, m) and S2 (n, m), while on the other hand the second contrast corresponding to the fixed pattern of the electron detector 17 does not, so that in the analysis image P (n, m) a first peak caused by the specimen structure will be observed at the position relative to the displacement, while a second peak caused by the fixed pattern will be observed at the origin. A very low contrast image of specimen structure such as a TEM image may often have the intensity of second peak caused by the fixed pattern larger than the intensity of first peak caused by the specimen structure. The images to which the displacement analysis has been applied heretofore were high contrast, high sharpness images obtained by an optical apparatus, with the effect of fixed pattern almost neglected such that the maximum intensity peak in the analysis image P (n, m) was determined to be the result of analysis. However, as the TEM images have considerable effect of the fixed pattern, the second peak caused by the fixed pattern might be determined as the result of analysis if the conventional peak detection method is applied in which the maximum intensity peak is the result of analysis, such that the analysis may often be complete without displacement detected.

A preprocess, such as normalizing of gains, for minimizing the effect of fixed pattern, by subtracting images by a fixed pattern previously captured, may be incorporated in the CCD camera controlling software. The fixed pattern used for the computation should be updated at a predetermined interval because the pattern is affected by aging. In order to minimize the influence of the fixed pattern the routine maintenance is indispensable. The change of fixed pattern due to the difference in capturing conditions such as the amount of irradiation of electron beam and the like is inevitable if the apparatus is routinely maintained. Although using only the normalization of gain may reduce the influence of fixed pattern, it will be difficult to completely eliminate it. Images of low contrast specimen structure such as electron microscopy images may have the second peak intensity larger than the first peak intensity of specimen structure even if any image processing such as gain normalization is performed on the paired images S1 (n, m) and S2 (n, m).

It is necessary for the displacement analysis of TEM images to add a step of automatically determining the first peak caused by the specimen structure from the analysis image having the first peak caused by the specimen structure together with the second peak caused by the fixed pattern. There are two algorithms as described below for automatic peak detection. Both algorithms make use of the fact that the second peak caused by the fixed pattern is observed at the origin.

Figure 7A:
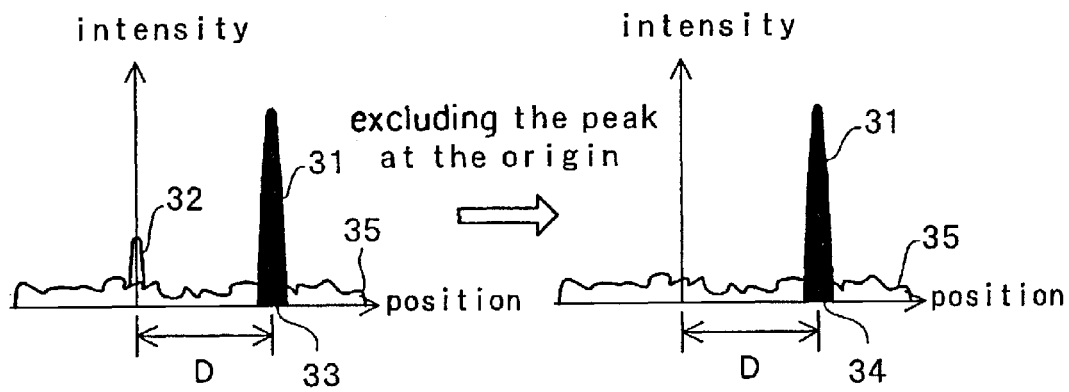
FIGS. 7A to 7C show schematic diagrams illustrating the position and intensity of peaks in analysis images, in case of a high contrast specimen, a low contrast specimen, and a specimen with small displacement, respectively.
Figure 7B:
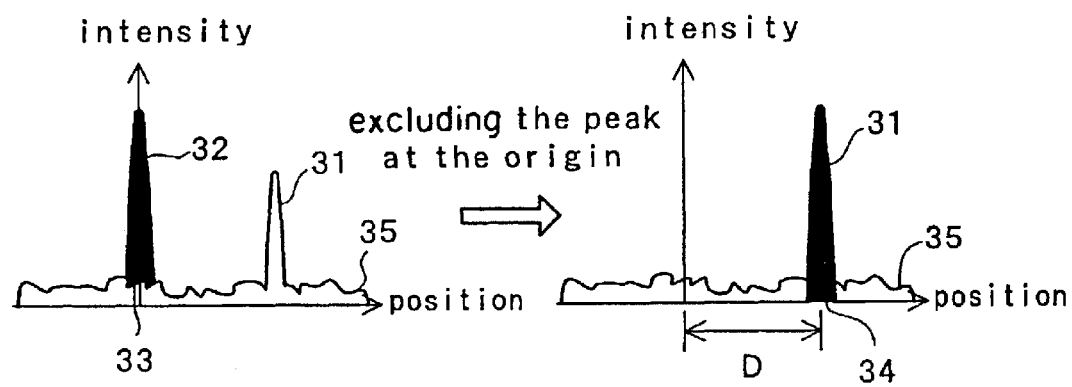
Figure 7C:
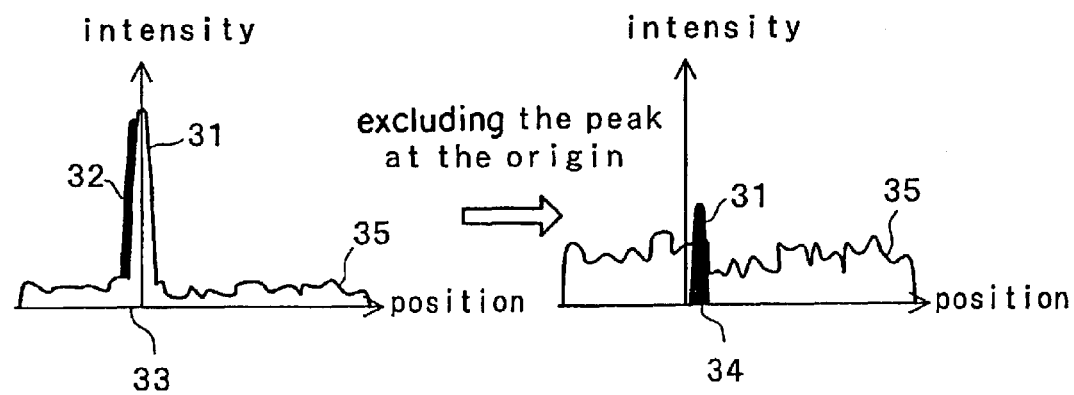
Figure 8B:
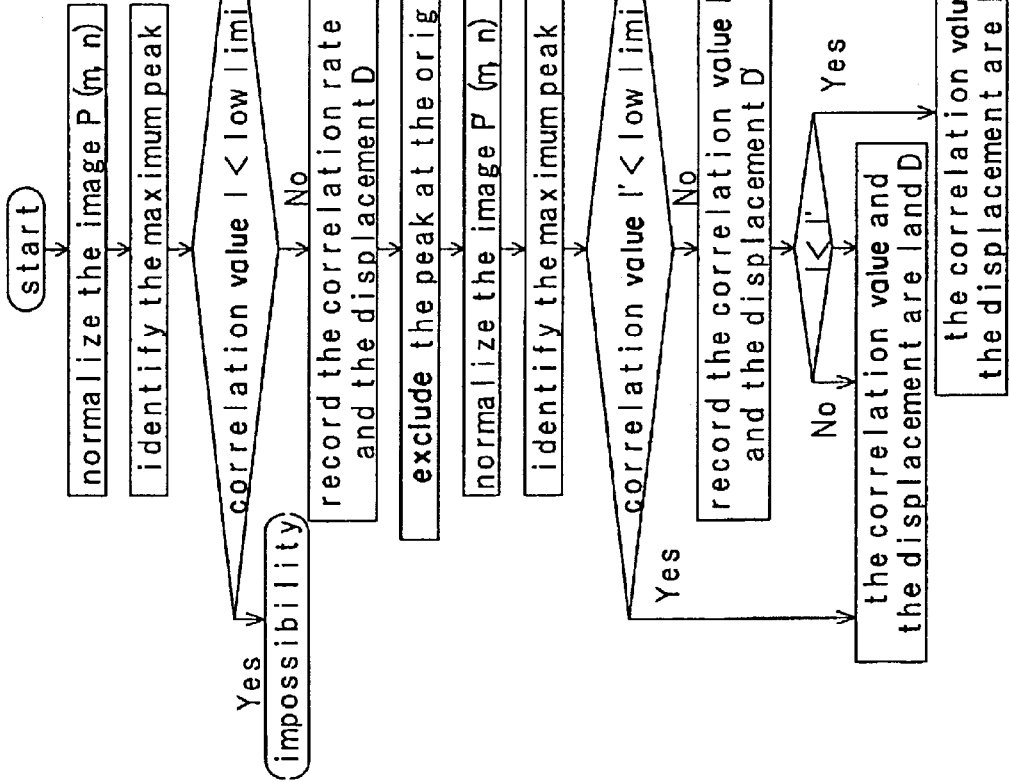
FIGS. 8A and 8B show flow charts illustrating the identification of peaks corresponding to the displacement from analysis images, in case of a process using a mask at the origin and a process outputting two peaks, respectively.
Figure 8A:
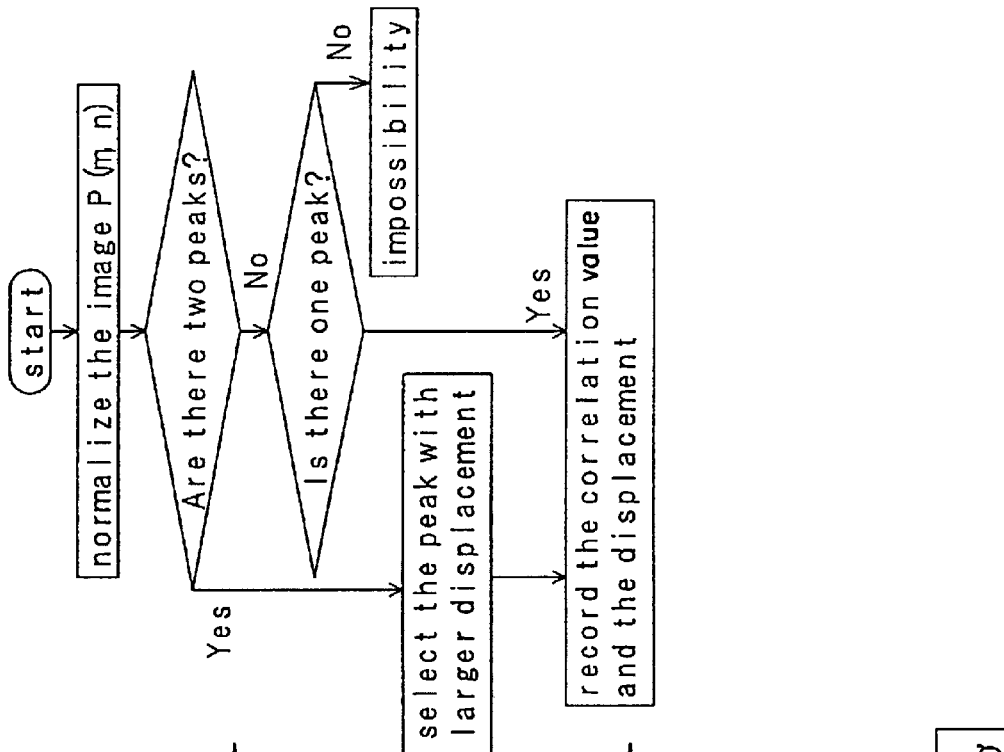

Since the second peak intensity caused by the fixed pattern appears at the origin, first algorithm applies a masking of the peak at the origin for substituting the intensity at the origin with a zero or a predetermined value. However, since the first peak may appear at the origin, the application of the exception at the origin is required to be determined. Now referring to a specific example shown in FIG. 7, the flow of peak detection will be described below. It is now assumed the position D1 and intensity I1 of the first peak 31 caused by the specimen structure, and the position D2 and intensity I2 of the second peak 32 caused by the fixed pattern. Since D2=0, there are predicted cases of |D1|>0 AND I1>I2 (FIG. 7A), |D1|>0 AND I1<I2 (FIG. 7B), and |D1|~=0 (FIG. 7C). For each case the intensity I of the maximum intensity peak 33 retrieved by normalizing the analysis image P (n, m) will be compared with the intensity I' of the maximum intensity peak 34 retrieved by normalization after exclusion of (masking of) the peak in the analysis image P (n, m) at the origin. In case of FIG. 7A, if the intensity of second peak is as small as it can be neglected, the intensity of the maximum intensity peak will be the same before and after exclusion of the peak at the origin, whereas if the intensity of second peak is strong enough then the intensity allocated to the second peak 32 by excluding the peak at the origin moves to the first peak 31 and noise 35, resulting in I≦I'. In case of FIG. 7B, without exclusion of the peak at the origin, the intensity allocated to the first peak 31 and the second peak 32 will be consolidated to the first peak 31, resulting in I<I'. In case of FIG. 7C, with exclusion of the peak at the origin, the first peak 31 will be eliminated together with the second peak 32, then only the noise 35 will increase, resulting in I>I'. The first peak 31 may be determined based on the comparison of the result of analysis with and without exception of the peak at origin. FIG. 8A shows the flow chart of the peak identification process. In this flow chart the intensities of the peak of maximum intensity with and without exception of the peak at the origin, namely the correlation values will be compared, and the result of analysis without the exception of the peak at the origin will be selected if the correlation value decreases by the exception of the peak at the origin, while on the other hand the analysis result with the exception of the peak at the origin will be selected if either the correlation value increases or remains.

As an alternative, assuming that there are two peaks in the analysis image P (n, m), the algorithm may be predefined such that the positions and intensities of two peaks will be output. The lower limit of the correlation should be redefined because the correlation value of each of peaks becomes weaker if there are two peaks. FIG. 8B shows two flow charts of peak identification processes. In cases of FIG. 7A and FIG. 7B the peaks larger than the lower limit of correlation value are the first peak 31 and the second peak 32, so that two peaks will be output. Since |D1|>|D2|=0, when selecting the peak of larger displacement from within the output peaks, the first peak will be selected. In case of FIG. 7C since the first peak and second peak are overlapped, there is only one peak in the P (n, m). If there is only one peak which is larger than the lower limit of correlation value, then that peak will be selected as the analysis result.

With respect to the setting of tilt angle $\alpha$, when determining the amount of defocus F based on the amount of displacement D using the parallax, the tilt angle $\alpha$ of electron beam incident to the specimen will be used, so that the tilt angle $\alpha$ should be set accurately. The measurement of the tilt angle $\alpha$ may be accomplished by using the diffracted image of a crystalline specimen having a known diffraction grid coefficient, such as Au and Si. As the diffraction grid coefficient is already known, if the wavelength of the incident electron beam is determined the diffused angle for each pixel in the diffraction image may be calculated. The actually measured value of the tilt angle $\alpha$ of incident electron beam may be obtained by determining the displacement D $\alpha$ in the first diffraction image taken at the first incident angle with the second diffraction image taken at the second incident angle to compute the product of the diffused angle for each pixel with the displacement D a. The tilt angle $\alpha$ of incident electron beam is approximately proportional to the current value IBT flew through the deflective coil for condenser system 13, however, as shown in FIG. 19 the deflective coil for condenser system 13 is mounted above the objective lens 14 so that the field caused by the objective lens 14 may alter the angle incident to the specimen. Therefore the compensator item should be introduced into the formulation of the tilt angle $\alpha$ of incident electron beam, using as a parameter the exciting current value $I_{obj}$ of the objective lens 14. For instance, the formula $\alpha = A^*I_{BH} + B^*I_{obj}^*I_{BH}$ may be used, where A and B are constants intrinsic to the apparatus.

With respect to the amplitude of the tilt angle $\alpha$, the larger the tilt angle $\alpha$ is, the smaller the amount of defocus F corresponding to the displacement D of image, therefore the improvement of the precision of analysis of the amount of defocus F may be estimated. However, the decrease of common area in the pair of images may invoke a malfunction. The correlation decreases if the common area decreases to the half of entire image or less, and the reliability of analysis results thereby extremely degrades. Thus the displacement D caused by the parallax is required to be set to be less than the half of the length of a side of CCD camera. When the estimated range of defocus is wider at the same magnification rate, namely in case of coarse focusing, the tilt angle $\alpha$ should be set to smaller, whereas when the estimated range of defocus is narrower namely in case of fine focusing, then the tilt angle $\alpha$ should be set to larger. For example, in case in which the estimated range of defocus is 20 microns, the length of a side of electron beam detector is 2 centimeters, and magnification rate is 50,000, then the angle $\alpha$ needs to be not more than 0.5 degree.

It may be possible that the analysis is unavailable because the common area of a pair of images is small due to the amount of defocus F that was larger than that was estimated. In order to address such a circumstance, a flow process should be provided in which a lower limit of the peak intensity should be set and then the magnification rate should be lowered if the computed peak intensity goes down below the lower threshold to increase the percentage of the common area to compensate for the focus in advance to thereby decrease the amount of defocus F to restore to the original magnification rate to measure again. As an alternative in order to increase the common area the tilt angle $\alpha$ may be decreased.

In the TEM observation the objective aperture to be inserted to the optical axis are often used to enhance the imaging contrast. It is possible that, if the direction of incidence of electron beam is changed, the electron beam will be out of optical axis so that the beam will not pass through the aperture. In order for the electron beam of first incident angle as well as the electron beam of second incident angle to pass through the aperture, the tilt angle $\alpha$ should be set smaller than the diameter of opening aperture. For instance, for the opening up to 10 microns, the tilt angle $\alpha$ should be set to 0.5° or less.

Since the second TEM image are to be taken with the incident electron beam slanted, if the tilt angle $\alpha$ of the incident electron beam is excessively larger then the image will be distorted due to the influence of the eccentric axis, the distortion will cause an extreme decrease of the common area with the first TEM image, resulting in that the analysis will be unavailable. In such a case the tilt angle $\alpha$ should be set again to smaller value.

The magnification rate M also is required for the calculation of defocus F. In the conventional TEM there are approximately 5% of magnification error.

In addition, when an optic lens is installed at the photo coupler 72 connecting the scintillator 71 to the CCD camera 73, the magnification error of optic lens also should be considered. Now considering the influence of such an error with respect to the error rate of focusing analysis in case in which there is an amount of error of M (1+$\Delta$), i.e., $\Delta$ in the magnification rate. It is assumed that for example a displacement D1 was measured. The pure amount of defocus F1 may be given by $D1/[M (1+\Delta) \alpha]^{-1} - Cs \alpha^2$, but the amount of defocus F1' may be given by $D1/[M \alpha]^{-1} - Cs \alpha^2$. The error of analysis of defocus F caused by the magnification error then may be F1-F1'=-$\Delta$D1/ (1+$\Delta$)M$\alpha$. The focusing error caused by the magnification error may be proportional to the amount of displacement D1. In other words, when the displacement D=0, the focusing error caused by the magnification error will be the smallest. Then the focus compensation toward Fs=-Cs $\alpha^2$ where the displacement D=0 may be attempted. When attempting to set the focus as Fs after the amount of defocus F1' has been determined, the focus will be (F1-F1')+Fs. The displacement D2 at this stage will be measured as D2=-$\Delta$D1. Since the magnification error $\Delta$ of the TEM is approximately 5%, a few times of focus compensation may lead to the displacement D~=0. In this manner, it can be seen that the focus error caused by the magnification error will be sufficiently small by means of such a process flow that the optimum focus specified may be set after the objective lens has been tuned to the displacement D=0. The process flow may alternatively be such that the focus is adjusted to D=M Cs $\alpha^3$, where F=0 in the vicinity of D=0, not at the displacement D=0. In this case the influence of magnification error will be decreased together with the influence of the second peak caused by the fixed pattern. The functionality is added which may abort the compensation for focusing in case in which the repetition of compensation for defocus F=0 is more than two and the amount of defocus Fn determined at nth path is larger than the amount of defocus $F_{n-1}$ determined at n−1th path. This allows the repetition of compensation to be held to the minimal requirement.

Figure 2A:
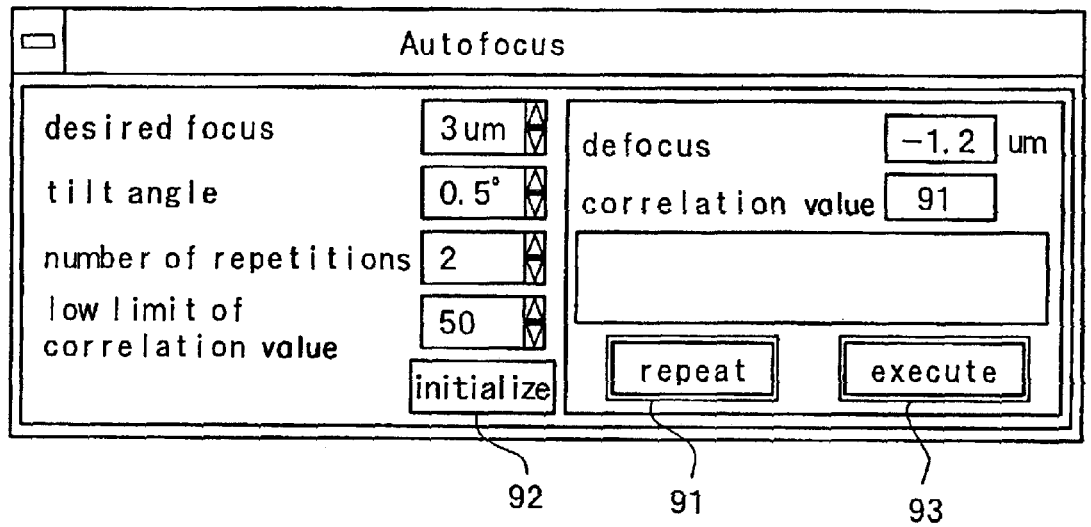
FIGS. 2A and 2B show schematic diagrams of screen display examples for setting parameters, and displaying the analysis result of the focusing.
Figure 9:
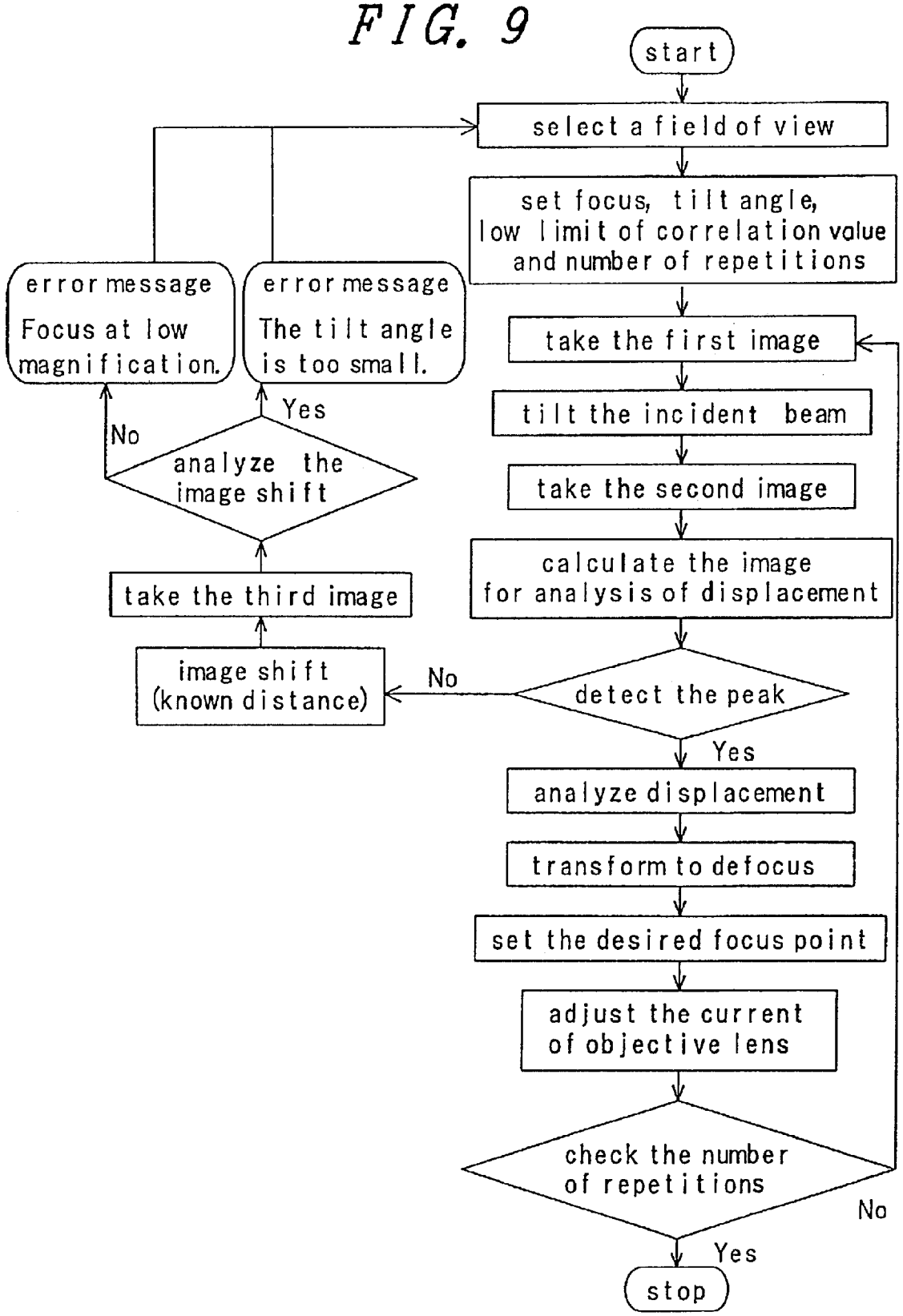
FIG. 9 shows a flow chart illustrating the focusing.

By taking above into consideration, focusing will be performed in accordance with the flow chart shown in FIG. 9. At the beginning, a field of view on which focus will be analyzed will be selected. The selection of a field of view includes also the setting of magnification rate of the observation and of objective aperture. Then the display examples shown in FIGS. 2A and 2B will be used to set the optimal focus, lower correlation threshold, tilt $\alpha$, and repetition of compensation. The recommended values i.e., the initial default values of the optimal focus, lower correlation threshold, tilt angle $\alpha$, and repetition of compensation are preset in the computer, which may be changed by the operator when required. Although the optimum focus is usually set to F=0, there may be cases in which under focus observation may be preferable depending on the specimens. The tilt angle $\alpha$ is set at default to 0.5°, the largest angle $\alpha$ available for passing the electron beam through the objective aperture of diameter up to 10 microns, however, there may be cases in which the tilt angle should be set to a smaller value, because the image distortion caused by the change of electron beam incident angle may severely affect to a certain fields of view. The lower correlation threshold also depends on the photographic conditions such as the number of pixels of the analysis image and the like. In order to optimize the tilt angle $\alpha$ and the correlation value, it will be necessary to provide a mode in which focusing will be analyzed but not compensated. In general the tilt angle $\alpha$ used routinely will be in the range from 0.2 to 0.5°. The lower limit of the tilt angle $\alpha$ and the upper limit of precision tolerance may be determined by the performance of the system. Only the measurement may be performed by setting the repetition of compensation shown in the display screen of FIG. 2 to 0, and clicking the button 93 for repeating focusing. If the operator cannot recall the recommended initial values during setting of the parameters, then by clicking on the "initialize" button 92, all parameters will default to the initial values.

Once the parameters are set, a pair of images may be taken by using the electron detector 17. The conventional focus detectors of TEM oscillates sinusoidally the angle of incident electron beam by using the deflective coil for condenser system 13 and the operator observes the vibration of TEM image.

Since the TEM image continues to vibrate in the conventional configuration of circuitry, capturing of images is not available. In order to capture images, a control system is required in which an image is captured upon receiving a signal instructing the capture of first TEM image, then the incident angle of electron beam is changed to second angle upon receiving a signal indicating the image capture has been completed, and a second image is captured thereafter.

From a pair of images captured by using such a control system, an analyzing image P (n, m) will be computed to identify the peak corresponding to the displacement.

Figure 2B:
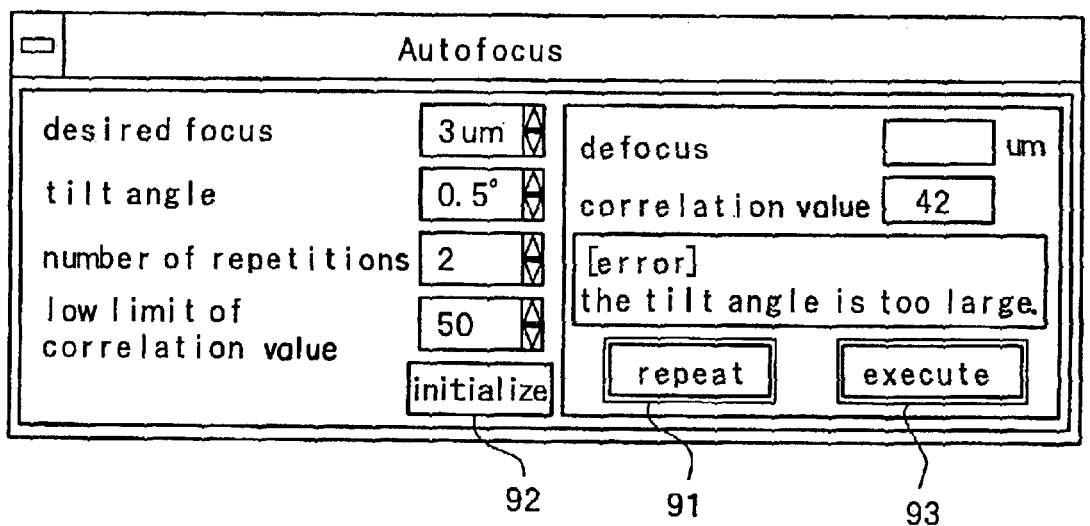

If any peaks corresponding to the displacement cannot be identified, a flow is provided so as to abort the focusing operation and to estimate the cause for instructing the operator what to do next. The possible causes which may fail the analysis of displacement may be caused by a problem in the image, such as for example no specimen found in the field of view, and an image extremely out of focus, or a problem of decrease of the common area between images in the pair such as the amount of displacement D excessively large due to the inclination too large of incident electron beam angle, and the distortion of images affected by the change of incident electron beam angle. In order to determine the cause, a fourth TEM image will be captured by translating the image by a known amount of distance in a direction by using the deflective coil for condenser system 16 at the first angle of incident electron beam to analyze the displacement between the first TEM image and the fourth TEM image. If, as a result, displacement analysis is impossible between the first and fourth TEM images, then there is a problem with respect to the images such as no specimen in the field of view, or the image extremely out of focus, or the like. To resolve such a problem an instruction may be issued so as to decrease the magnification to perform a preliminary focusing at lower magnification. At a lower magnification a vaster field of view may be obtained, resulting in that the chance of finding the specimen in the field of view will increase. In addition at a lower magnification the influence of blurred image caused by the defocus may be decreased and the sharpness may be improved so that the analysis of displacement will be enabled. If the displacement between the first TEM image and fourth TEM image may be analyzable, the cause may be the decreased common area between images in the pair, therefore an instruction should be issued to reduce the amount of tilt angle $\alpha$. The system will display an error message on the display screen as shown in FIG. 2(b). Although the correlation rate will be displayed the amount of defocus F that could not be determined will not.

Once the peak corresponding to the displacement has been identified, the current through the objective lens will be adjusted by determining the displacement D therefrom to calculate the amount of defocus F by means of the relation D=M$\alpha$ (F+Cs $\alpha^2$).

Since the relationship between the current of objective lens and the focal distance may vary depending on the parameters of the projector lens that means the observing magnification rate, a relational table or a relation describing the current of objective lens with the focal point for each observation magnification rate is stored in the computer. The current of objective lens will be adjusted by using the table or relation to determine the current required for focusing at the desired focus. In case in which the number of repetition of focusing is set to two or more, another pair of images will be taken to analyze the focus to readjust the current of objective lens.

The automatic focus compensator system in accordance with the present invention incorporates a displacement analysis processor using phase variance of Fourier transform images 20, implemented by a digital signal processor (DSP), which may complete the analysis of displacement of an image of 256 by 256 pixels within 30 milliseconds, in comparison with the same calculation for 2 seconds by a conventional application software. One focus compensation cycle will be completed within one second, including the image capture by the electron detector 17, the adjustment of the deflective coil for condenser system 13 and the objective lens 14, and the system can also perform an iterative focusing. The iterative focusing starts by clicking the button to repeat focusing, as shown in FIG. 2, and the iterative focusing stops by clicking the button to stop focusing. Alternatively by clicking the button to repeat focusing the iterative focusing starts, and the focusing may be stopped by clicking the same button again. Alternatively by double clicking the button to execute focusing 93 the iterative focusing starts, and the focusing stops by clicking the button to execute focusing 93 again. In the course of repeating focusing the focus will be automatically readjusted to an optimal focus even when the field of view changes by moving the specimen stage. When the first TEM image and the second TEM image are taken during moving the specimen stage, the precision of focal analysis will be degrade because of introduction of the displacement D caused by the parallax along with the displacement Ds of moved specimen stage, however, the precision of focusing required for the specimen observation may be obtained since the observation may be started by stopping the specimen stage when the desired field of view has been found. In case in which the degraded precision of compensation by the moving specimen stage is concerned, the focus may be analyzed by measuring the moving speed of the specimen stage from the displacement between the first TEM image captured for the nth focusing analysis and the first TEM image captured for the n−1th focusing analysis to estimate the displacement Ds caused by the moved specimen from the first TEM image to the second TEM image in the nth measurement, and by subtracting the displacement Ds caused by the moved specimen from the displacement D+Ds between the first TEM image and the second TEM image to extract the displacement D caused by the parallax.

In the present system a malfunction checking functionality is built in so as to hold the focus setting if the correlation value is less than the lower threshold. The TEM image in general has low S/N ratio, and the image of low S/N ratio may potentially have a higher probability that the displacement analysis is not executable. If the displacement analysis is unavailable because of the probability, then the analysis in the next turn will have a higher probability of obtaining a correct result. Therefore the upper limit of the number of errors will be predefined in the focus analysis. If the number of times that the correlation falls below the lower threshold exceeds the upper limit, the system provides a functionality to determine whether there has been an accidental event, such as the TEM image of the structure of specimen was not captured by the electron beam detector because the electron beam was blocked by for example the aperture and the like, and to display an error message on the screen.

During the iterative focusing, the first TEM image by the first incident angle and the second TEM image by the second incident angle are alternately displayed on the display screen. When the image processing speeds up, the alternate display may be perceived as a kind of flicker of the display, giving the operator an uncomfortable feeling or a difficulty to observe fine structures. Therefore the present system provides a configuration in which the TEM image captured with the first incident angle will be displayed on the screen, whereas the TEM image captured with the second incident angle will not be displayed. Another configuration may also be provided, in which the TEM image observed at the first incident angle and the TEM image observed at the second incident angle are separately displayed, so that the influence of image distortion caused by the axial displacement of the incident electron beam may be confirmed when required.

[Second Embodiment]

FIG. 19 shows a fundamental arrangement of TEM used in an automatic analyzer. The TEM is comprised of an electron gun 11 and electron gun control circuit 11', a condenser lens 12 and condenser lens control circuit 12', a deflective coil for condenser system 13 and deflective coil control circuit for condenser system 13', an objective lens 14 and objective lens control circuit 14', a projector lens 15 and projector lens control circuit 15', a deflective coil for condenser system 16 and deflective coil control circuit for condenser system 16', an electron detector 17 and electron detector control circuit 17', a specimen stage 18 and specimen stage control circuit 18', and a computer with control software and image processing software 19. Each of control circuits may receive control commands sent from the control software in the computer 19, perform controls and return the return value to the computer. There is provided an image shift function for translating the TEM image by using the deflective coil for condenser system 13 and the deflective coil for condenser system 16. The electron detector 17 is a detector constituted of a plurality of pixels such as a CCD camera, which may transmit signals of obtained images at a higher rate through the cable for image transmission to the storage device of the computer 19 or to the displacement analysis processor using phase variance of Fourier transform images 20. The displacement analysis processor using phase variance of Fourier transform images 20 is connected to the computer with control software and image processing software 19, which further comprises a software for pattern inspection and measurement.

Figure 10:
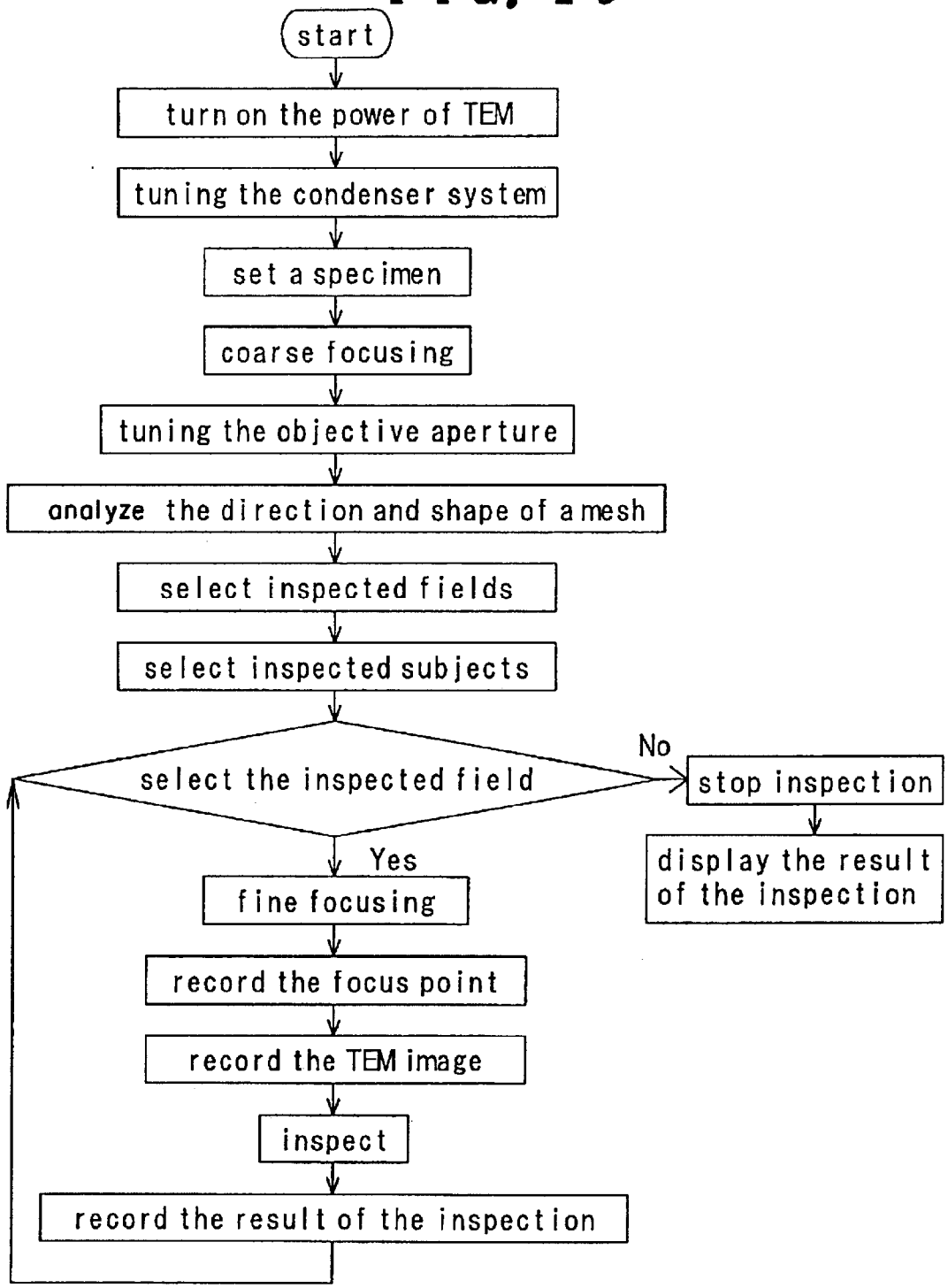
FIG. 10 shows a flow chart illustrating the automatic analyzer using a TEM.
Figure 11A:
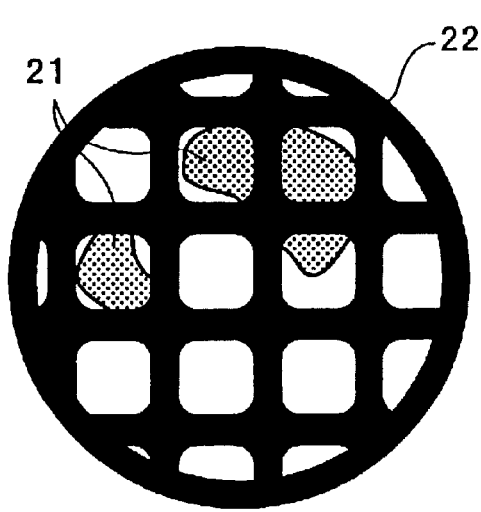
FIGS. 11A to 11D, respectively, show schematic diagrams illustrating the identification of analyzing areas by determining the direction and the shape of a mesh 22, in case of a TEM image of the mesh 22 at a lower magnification power, an image labeled and binary coded, the relationship between the gravity center 24 of holes 23 and the direction of mesh 22, and identified holes 23 each of which is split into a plurality of analysis areas.
Figure 11B:
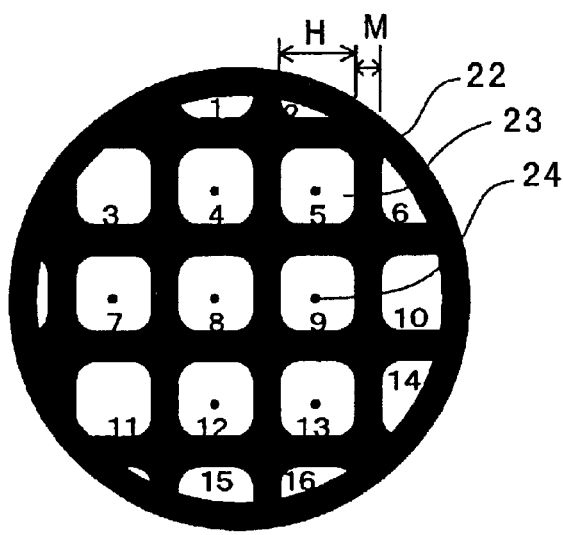
Figure 11C:
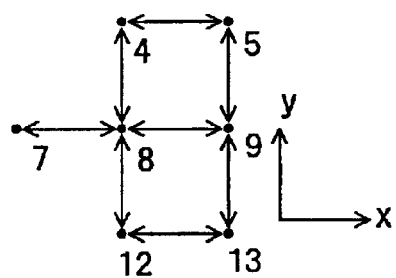
Figure 12:
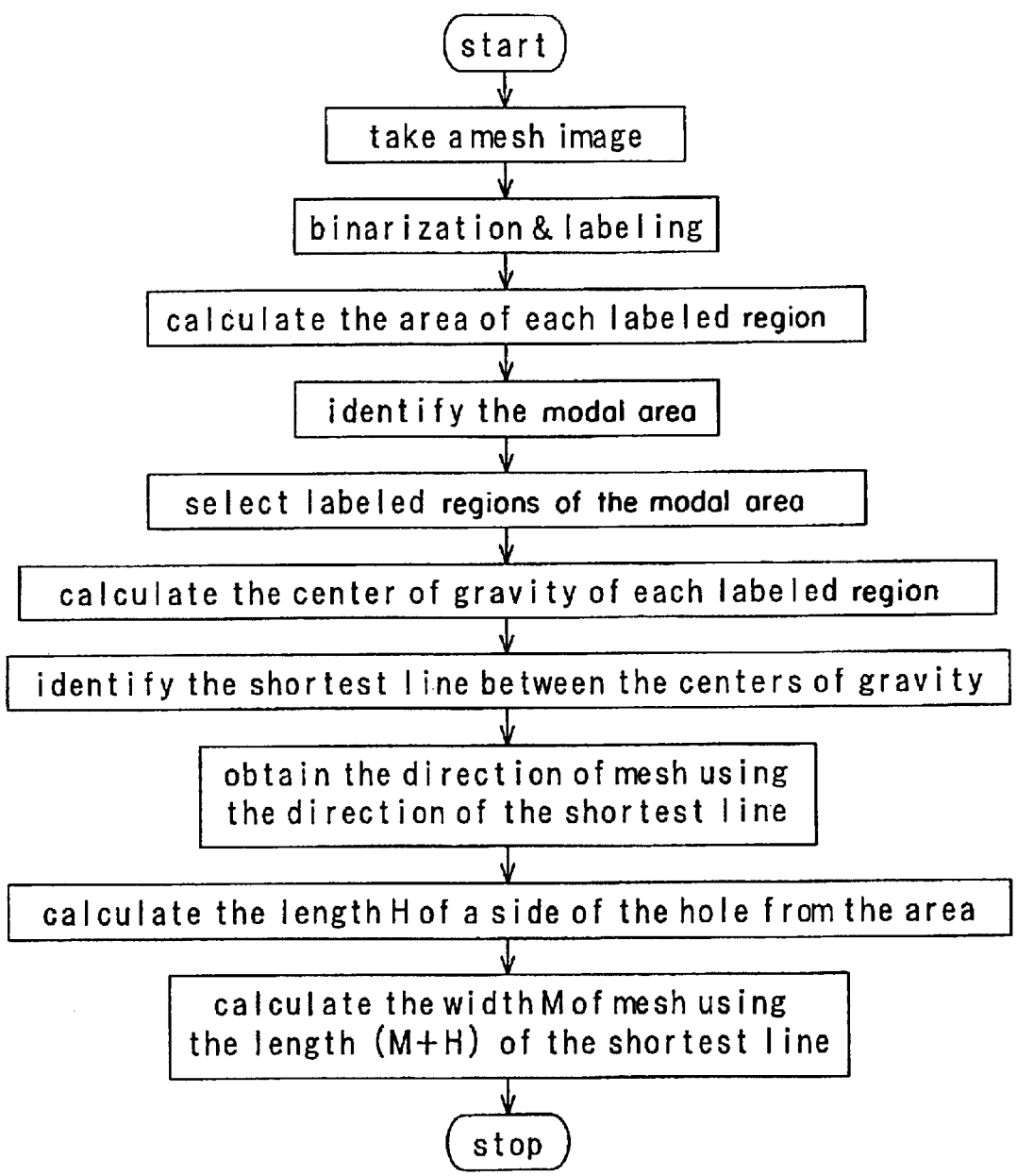
FIG. 12 shows a flow chart illustrating analysis of the direction and shape of a mesh.

FIG. 10 shows a process flow of the automatic analyzer using the TEM in accordance with the present invention. An acceleration voltage is applied to the electron beam generated by the electron gun 11, then the deflective coil for condenser system 13 is used for adjusting the deflection of beam such that the electron beam passes through the optical axis, to verify that the electron beam reaches to the electron detector 17. In this document 'z' axis is defined as an axis in parallel to the optical axis, x-y plane is defined as the plane normal to the optical axis. After adjusting the condenser lens 12, a specimen 21 is put into the specimen chamber. The specimen 21 is thinned (sliced) to allow the electron beam to pass through, and then is mounted on a metallic support member that is also called a 'mesh' 22 (FIG. 11(a)). The mesh 22 is placed in a specimen holder, which is in turn placed on the specimen stage to be observed. Since the diameter of the mesh 22 is approximately 3 millimeters, it is difficult to accurately specify the direction and position thereof when placing on a specimen holder. Therefore in accordance with the process flow shown in FIG. 12 the image of the mesh 22 observed at a lower magnification rate is recorded to analyze the direction, position, and shape of the mesh 22. The electrons may transmit only through the void region called 'hole' 23. At first, the captured image will be binary coded to determine the connective components to label each region (see FIG. 11B). Then the surface area of each of labeled regions will be calculated. Since the holes are almost constant in size, the modal (most frequent) value among the surface area values may be defined as the surface area of a hole. More specifically, among the regions labeled as shown in FIG. 11B, the regions having a size in proximity of the modal are regions labeled as 4, 5, 7, 8, 9, 12 and 13, where the shape of entire holes is depicted. To analyze the direction of the mesh 22, the center of gravity 24 of the labeled regions in which the hole 23 is entirely depicted will be computed. Then a combination having the shortest distance between the center of gravity of a region with respect to another will be determined (FIG. 11C). For instance, the nearest centers of gravity from the center of gravity 24 of the labeled region 4 are the centers of gravity 24 of the labeled region 5 and of the labeled region 8. The direction connecting the center of gravity 24 of the labeled region 4 with the center of gravity 24 of the labeled region 5 will be defined as the x direction, while the direction connecting the center of gravity 24 of the labeled region 4 with the center of gravity 24 of the labeled region 8 will be defined as the y direction. Since the shape of the hole 23 is known, the height H of a side of hole 23 may be given from the surface area of the hole 23. By subtracting the height H of a side of hole 23 from the span of the shortest line between the nearest centers of gravity, the margin M of the mesh 22 may be computed. Once such calculation is completed, an image display that the x-y direction of the mesh 22 matches with the horizontal and vertical direction of the display will be displayed. Each hole 23 of the mesh 22 will be numbered. The operator may confirm on this display at this point that the labeling has been correctly executed. By directing a number labeled to a hole 23, a hole 23 containing a specimen 21, i.e., a hole 23 to be inspected may be defined so as not to inspect other holes to shorten the time of inspection.

The presence or the absence of specimen in a hole may be determined automatically by image processing. The automatic decision uses a histogram or Fourier transform image of the image intensity in the hole. The decision using a Fourier transform image uses the percentage of high frequency component in the Fourier transform image.

Figure 17A:
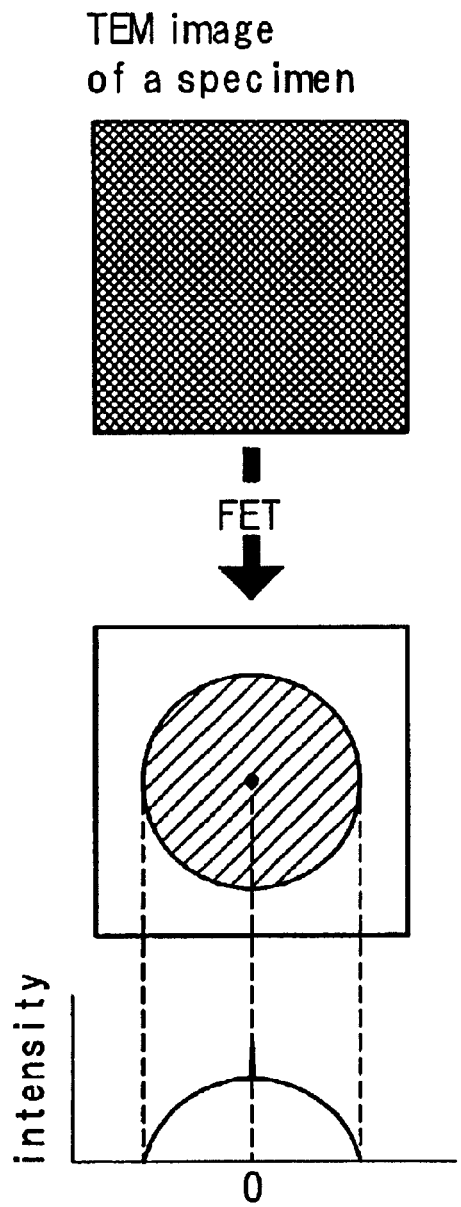
FIGS. 17A and 17B show schematic diagrams illustrating determining the presence and absence of specimen in a TEM image, in each case of a TEM image and the distribution of high frequency component of the Fourier transform image thereof when a specimen is present, and when no specimen is present.
Figure 17B:
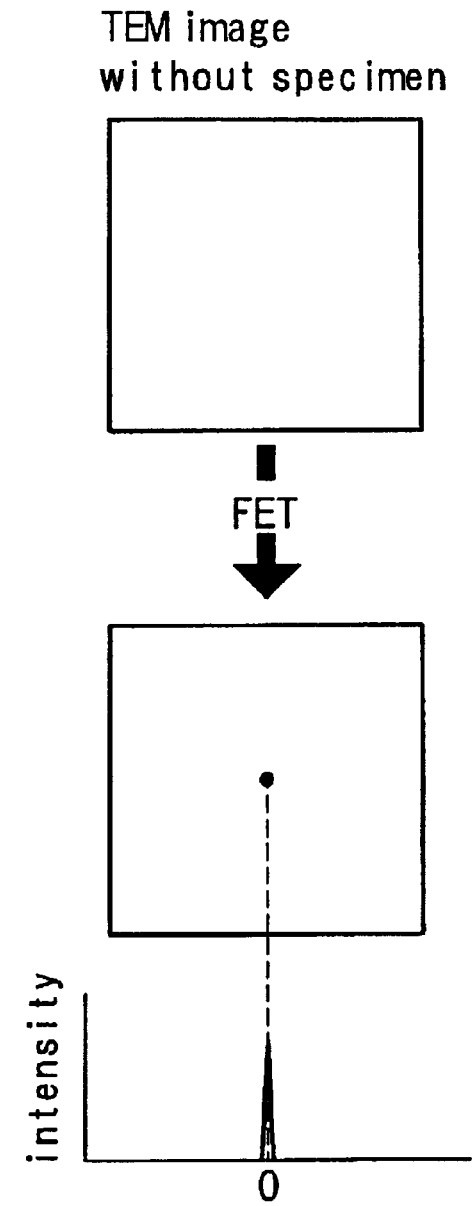

When no specimen is present in the analytic area, as shown in FIG. 17B, the Fourier transform image contains only low frequency components, even though there is a certain fluctuation in the image intensity depending on the distribution of the current density of irradiated electron beam. If a specimen is present which contains a fine structure such as in case of biological specimens, the percentage of high frequency in the Fourier transform image will be increased (FIG. 17A). It may be determined that the specimen is present in the analytic area to be inspected in case in which the percentage of high frequency component with respect to the low frequency component exceeds a certain threshold. When determining based on the histogram of image intensity, the presence or absence of specimen will be determined in accordance with the number of peaks present in the histogram of the intensity of image. If no specimen is present in the hole, there will be only one peak (see FIG. 13B) even though the image intensity may fluctuate more or less depending on the distribution of the current density of irradiated electron beam. On the other hand if there is a specimen in the hole, then there will be a plurality of peaks present in the histogram of image intensity containing the specimen in the hole (see FIG. 13A). Accordingly it may be determined that the specimen is present in the hole when there is a plurality of peaks in the histogram of image intensity. It should be noted that the presence or absence of specimen may be determined based on the half-width of peaks in case of specimens which have a contrast so low that the peaks may be overlapped.

Prior to analyzing the direction and the shape of mesh 22, it may be desirable to adjust the height of the specimen holder. There may be a case in which the specimen holder is placed outside the focusing range that the objective lens maybe adjust, because of inappropriate adjustment of the specimen stage 18. When the stage is appropriately placed within the focusing range, the magnification rate and the like may vary due to the variation of lens condition when the current flew through the objective lens is drastically varied, therefore it may be desirable to keep the height of the specimen holder approximately constant. In the focusing analyzer as will be described later, a functionality is provided to automatically adjust the height of the specimen holder by analyzing the height of the specimen holder and driving the specimen stage control circuit 18'.

The specimen holder may be inserted slantly because of for example inappropriate setting of specimen stage 18. If the specimen holder is seriously inclined, the condition of observation depends on the position of hole in the mesh 22. Therefore by selecting a plurality of points in the mesh 22, the position of those points and the height of specimen determined by the analysis of defocus will be recorded. The inclination angle of the specimen holder may be given by the height of specimen in each of positions, and the inclination of the specimen holder can be adjusted accordingly.

The specimen stage control circuit 18' contains the automatic adjuster of the inclination of the specimen holder.

Figure 11D:
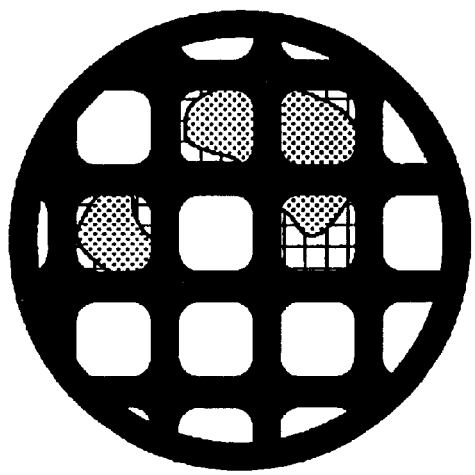

Then items of inspection will be set. Most of automatic inspection of biological specimen are often the research of the shape and number of viruses. For each of viruses various items of inspection such as preprocess of image and the geometrical characteristics to be searched may be configured and stored in the computer 19 as a macro program. For instance, now considering a case of measuring the number of spherical viruses having diameter in the range of approximately 20 nm to 30 nm, dispersed in the specimen, and the diameter thereof. The items of information required to be inspected are solely the number and diameter of viruses, then the TEM image of the specimen having viruses strongly stained should be captured by using the electron detector 17, then the image thus captured should be binary coded to extract the stained regions, i.e., viruses to analyze the geometrical characteristics to measure the diameter of viruses. To this end, the size of the area to be analyzed will be selected. The number of pixels contained in an image used for the viral inspection may be 512 by 512 pixels, and when measuring the diameter of viruses within an error of approximately 10%, in order for the diameter of a virus to be about 10 pixels the suitable length of a side of square of the analytic area will be preferably about 1 micron. If the length of a side of hole is 30 microns, then one hole will be divided into 30 by 30 areas, or 31 by 31 areas with an overlap of about 30 nm between areas so as to prevent the count from being dropped therebetween. Once the division of areas has been completed a display as shown in FIG. 11D will be displayed on the screen to indicate the areas to be inspected.

Figure 13A:
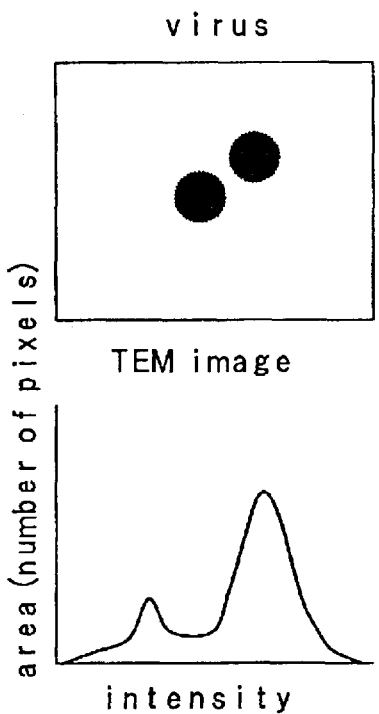
FIGS. 13A and 13B show schematic diagrams illustrating determining the presence and absence of specimen in a TEM image, in each case of a TEM image and image intensity histogram thereof when a specimen is present, and when no specimen is present.
Figure 13B:
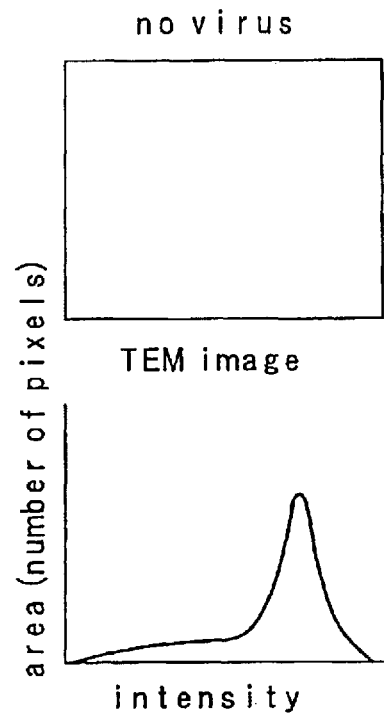

Since every areas to be inspected do not contain a specimen, if the specimen is not present in an area to be inspected, it will be better move to next area immediately for saving the time of inspection. The system provides a functionality of determining the presence or absence of the specimen in a specific area to be inspected, by using the histogram of image intensity or the Fourier transformed image in that area. As have been described above, the specimen was prepared such that only viruses are strongly stained, the area containing the specimen may be presumably different in the image intensity from the area containing no specimen. If there is the specimen present in the area to be inspected, as shown in FIG. 13A, the histogram of the image intensity will have a plurality of peaks. On contrary if the specimen is not contained in the area to be inspected as shown in FIG. 13B, then there will be only one peak, though the image intensity may fluctuate in accordance with the distribution of the current density of irradiated electron beam. As a result, the presence or absence of viruses may be determined in accordance with the number of peaks present in the histogram of image intensity. In case of the decision using the Fourier transformed image the decision will be made based on the percentage of high frequency component in the Fourier transformed image. If the specimen is not present in the area to be inspected, as shown in FIG. 17B, there is only low frequency component in the Fourier transformed image. On the other hand, if the specimen is present in the area to be inspected, which contains a fine structure such as in case of biological specimen, the percentage of high frequency component in the Fourier transformed image will be augmented (see FIG. 17A). It may be determined that a specimen is present in the analytic area in case in which the percentage of high frequency component with respect to the low frequency component exceeds a certain threshold.

In a hole of 30 microns square, the diagonal distance is 42 microns. If the specimen holder is inclined by 1°, a defocus of 0.74 micron may be occurred in the hole. The contrast of TEM images is susceptibly affected by the defocus. If there is a defocus in the order of submicron, the image will be blurred or the contrast will be varied. Viral inspection has to be always performed with the image taken at a constant and precise focus. The focusing should be well compensated for in the order of submicron prior to starting a viral inspection.

The focal analysis using the parallax is applied to the focal analysis in such a focus compensation. A first TEM image taken with the electron beam incident from a first angle approximately in parallel to the optical axis and a second TEM image taken with the electron beam incident from a second angle inclined by a tilt angle α from the optical axis are used. As shown in FIG. 4, if the focus is not to the point, there may be a certain displacement of image between the first TEM image and the second TEM image. The defocus F and the displacement D caused by the parallax are related in $D = M\alpha(F + Cs\alpha^2)$. The magnification M and the tilt angle α may be selected by the operator. The spherical aberration coefficient Cs is intrinsic to the apparatus, so that the defocus F may be identified if the displacement D between images in the pair is determined. The conventional method of analysis of displacement used heretofore such as cross-correlation method, least-squares method and the like, could not obtain a sufficient precision of focal analysis because the analytic precision of the analysis method of displacement did not reach to less than one pixel. The present invention is characterized in that it applies a method of analysis based on the phase variance analysis of the Fourier transformed image to the analysis of the displacement D. As shown in FIG. 1, the first and second TEM images having the incident angle of the electron beam varied with respect to the specimen by using the deflective coil for condenser system 13 mounted above the objective lens 14 will be captured by the electron detector 17. Thus captured first and second TEM images will be transmitted to the displacement analysis processor using phase variance of Fourier transform images 20 and in turn the displacement D that is the analytic result will be transmitted to the computer 19, which will compute the amount of defocus F from the displacement D to determine the current of the objective lens $I_{obj}$ required to adjust the focus to the target point, and then compensate for the focusing of the objective lens 14.

FIG. 5 shows a schematic diagram illustrating the displacement analysis method applied to the present invention. Now assuming a pair of images S1 (n, m)=S2 (n+dx, m+dy) having a certain displacement D=(dx, dy), and the two dimensional discrete Fourier transform of S1 (n, m) and S2 (n, m) to be S1' (k, l), and S2' (k, l). From the formula F {S (n+dx, m+dy)}=F {S (n, m)} exp (idxk+idyl) of the Fourier transform, S1' (k, l)=S2' (k, l) exp (idxk+idyl) may be obtained. The displacement in S1' (k, l) and S2' (k, l) above may be expressed by the phase variance exp (idxk+idyl)=P' (k, l). P' (k, l) is a wave with the cycle (dx, dy), then in an image P (n, m) which is subjected to invert Fourier transform of a phase variant image P' (k, l), a δ peak will be appeared at the location (dx, dy) Since it can be assumed that in the image P (n, m) only the δ peak may be present, the position of δ peak may be given by the computation of the center of gravity of the intensity of δ peak even if a fraction is present.

The intensity of δ peak calculated after normalizing the intensity of entire image P (n, m) will be weaker if the noise i.e., discrepancy between images in the pair is increased. Thus the operator may identify the signal-noise ratio, i.e., reliability of the analysis result by indicating the peak intensity as the correlation value. In the automatic compensator the analysis is not always assured to be accurate in every area. Therefore, the lower threshold of the correlation will be predetermined so as no to adjust the objective lens if the correlation value calculated is below the lower threshold to record the address of the analysis area along with the correlation value. For example, if the position of mesh is shifted out of the point by an incorrect operation in the course of transfer of the specimen stage, more than half of a captured TEM image will be occupied by the mesh 22 as well as the common area of the pair of images will decrease so that a sequence of unanalyzable area will be left at the edge of holes 23. Once the displacement D has been analyzed, after the automatic inspection completed, to allow to determine, based on the distribution of unanalyzable area, whether the mesh was moved into the analysis area due to the inaccurate operation of the specimen stage and at which step in the course the incorrect transfer of the specimen stage was occurred, the operator may instruct to compute the focus F using the relation $D = M\alpha(F + Cs\alpha^2)$ to determine the current value required for bringing to the specified optimal focus to adjust the current of the objective lens. After the objective lens is adjusted, by performing another focus analysis using the parallax to record the correlation value in this displacement analysis and the current of the objective lens along with the address of the analysis area, the status of the inspection may be recorded in greater details. The distribution of the specimen height may be derived from the current of the objective lens set at the optimum focus. In addition the image quality such as sharpness may be allowed to compare by using the correlation value calculated at the same displacement D.

Figure 14:
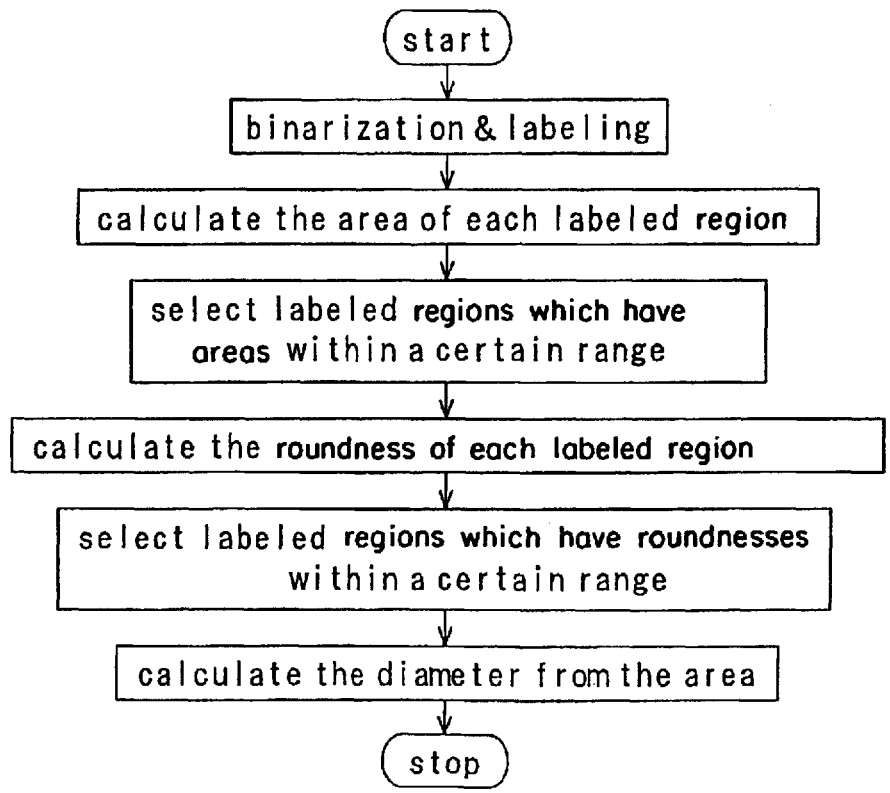
FIG. 14 shows a flow chart illustrating viral inspection in an analysis area.

Once the focusing adjustment has been completed, a viral inspection may be started in accordance with the process flow shown in FIG. 14. Although another TEM image may be taken for the inspection, a TEM image which has been already taken at the incident angle 1 of the electron beam with the optimum focus is recorded, and this image may be used for the viral inspection in order to save the time of imaging. In a viral inspection, the TEM images will be binary coded to make the connecting component to label every regions. Then, the surface area of each of labeled regions will be computed to eliminate the region having less than a predetermined surface area, because these smaller regions may be determined as noise. Then, the characteristic amount of biological specimen will be computed from the roundness and moment of each of the labeled regions, and the region identified to be closer to a roundness will be determined to be likely a virus, thereby the diameter (biological information) will be derived from the surface area. The number of viruses and the diameter of each virus will be recorded together with the address of the analytic area in a similar manner.

Once the inspection has been completed in one area to be analyzed, the specimen stage 18 may be used to transfer the specimen to move to a next area to be inspected to start the inspection. The precision of fine adjustment of the specimen stage 18 may be described by the registering accuracy and the back-rush thereof. The registering accuracy is the accuracy of transfer in a constant direction of moving the specimen stage, the back-rush is the distance of slipping at the time of turning the direction. In the products currently available in the market, the registering accuracy is achieved in the order of about 1.2 nm, back-rush in the order of about 0.02 micron. In case of analytic areas of diameter of 30 microns, the specimen transfer may be accomplished by using the specimen stage 18.

However, when moving the specimen stage 18, a certain amount of specimen drift may be occurred by the inertia of the specimen stage 18. In the focusing analysis using the parallax, the precision of focusing analysis will be degraded if the displacement D caused by the parallax is intermixed with a certain amount of displacement Ds caused by the drift of specimen. To avoid this, a third TEM image, which may be taken at the first incident angle of the electron beam at a second time different from the time at which the first TEM has been taken will be used. The amount of specimen drift may be computed from the amount of displacement between the first TEM image and the third TEM image. This displacement analysis also may be performed by means of the displacement analysis using phase variance of Fourier transform images. The precision of focus analysis is likely to be degraded unless the displacement Ds caused by the specimen drift is analyzed at the same analytic precision as the analysis of displacement D. In addition, the measurement of drift of specimen has to be completed within a very short period of time, and the amount of displacement caused by the specimen drift are to be significantly small. The conventional analysis of displacement, in which the analytic precision may be limited by the size of a pixel, obviously has not sufficient precision. The displacement D caused by the parallax may be given by subtracting the displacement Ds caused by the specimen drift from the amount of displacement between the first and second TEM images. In addition, the blur caused by drift in the captured images may be removed by performing an automatic drift compensation for operating the deflective coil for condenser system 16 so as to cancel the displacement Ds caused by the specimen drift.

The occurrence of specimen drift which may affect to the focal analysis may be estimated in some extent, such as at the time when the electron microscope has been just powered on, during the period of time until the difference of temperature in the microscopy and/or the electron gun will be settled, and at the time immediately after the moving specimen stage 18 is stopped. Since the efficiency of analysis will be lowered if a number of images are to be captured, then the condition of observation to capture the third TEM image for compensating for the drift may be predetermined, and when the condition matches, the third TEM image will be taken along with the first and second TEM images so as to enable to eliminate the influence of drift. If the algorithm is implemented in which only the first and second TEM images are captured once the drift decreases, in other words when the amount of displacement between the first TEM image and the third TEM image reaches to or in the vicinity of zero, the accurate compensation of focusing may be accomplished with the least number of TEM images required.

The efficiency of inspection will be degraded if a third TEM image used for compensating for the drift of specimen is taken each time the specimen stage 18 moves. Therefore, the transfer of the specimen stage 18 may be limited to the transfer between holes and the transfer between the analytic areas may be performed by the deflective coil for condenser system 16. The number of third TEM image to be taken will be significantly decreased since the compensation of specimen drift caused by the inertia of the stage transfer will be performed only when moving between holes. Other examples requiring the transfer of analytic area by using the deflective coil for condenser system 16 include, for example, a case in which the final precision is insufficient with the precision of fine focus adjustment of the specimen stage 18 with respect to the transfer of analytic area because the analytic areas are subdivided into small areas.

Figure 18C:
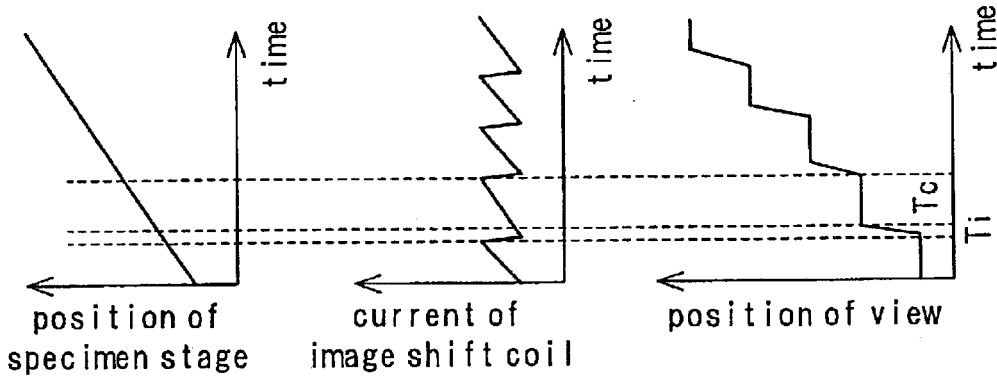
FIGS. 18A to 18C show schematic diagrams illustrating the position of observing field, positional setting of image shift, positional setting of specimen stage in the course of elapsed time, when the analysis area is shifted by moving a specimen on the specimen stage 18, image shifting by means of deflective coil 16 for condenser system, and image shifting by means of both the movement of specimen and image shifting, respectively.
Figure 18B:
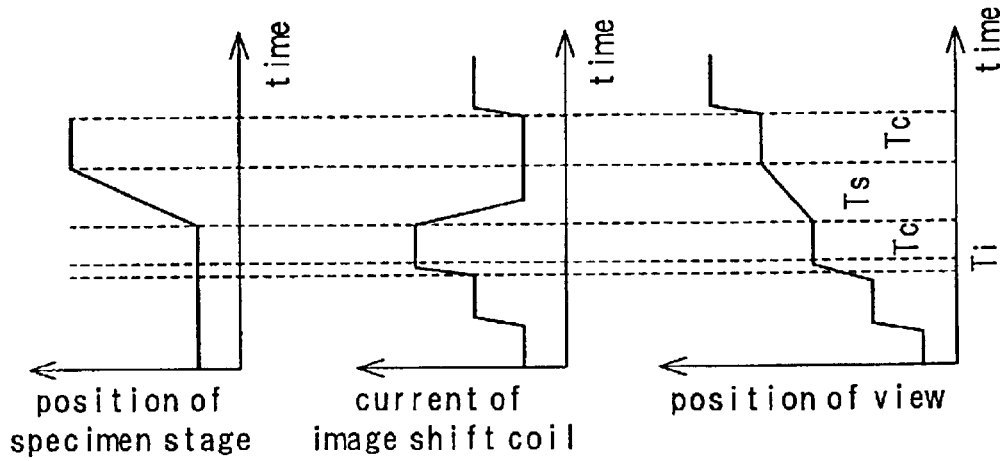
Figure 18A:
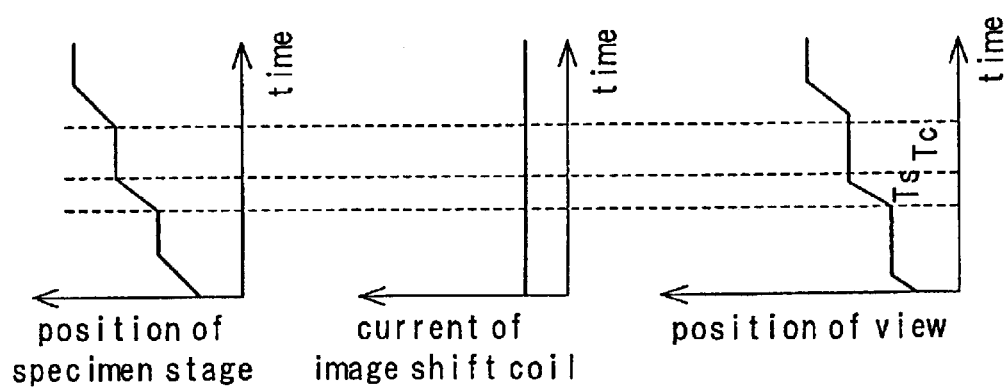

If the size of a hole is enough vast so that the deflective coil for condenser system 16 cannot follow, the image may be shifted by moving the specimen stage 18 into a direction at a constant velocity and using the deflective coil for condenser system 16 to move at an approximately same velocity. FIG. 18 C shows the location of the field of view when the transfer of the specimen stage is used together with the image shifting in order to move between analytic areas, the parameters of the deflective coil for condenser system 16, and the position of the specimen stage 18 along with the elapsed time. Here Tc designates to the time required for taking a TEM image, Ts to the time required for transfer of the field of view by the specimen stage, and Ti to the time required for the transfer of the field of view by the deflective coil for condenser system 16. The transfer of the field of view by using the specimen stage 18 may be accelerated but the speed-up is limited due to the influence of inertia when moving the stage and the back-rush, the transfer of field of view by using the specimen stage 18 may not be accelerated faster than the transfer of field of view by using the deflective coil for condenser system 16. If the field of view is transferred solely by means of the specimen stage 18, the time of inspection will be prolonged as shown in FIG. 18A. On the other hand the deflective coil for condenser system 16 has a disadvantage of narrower range of transfer. As shown in FIG. 18B, when the transfer is out of range of the deflective coil for condenser system 16 the specimen stage 18 should be used to move the specimen. Accordingly, when moving the specimen stage 18 at a constant velocity as shown in FIG. 18C while using the image shifting by means of the deflective coil for condenser system 16 so as to cancel out the movement of the specimen stage, still images of each of analytic areas may be taken even when the specimen stage 18 is in the course of transfer. In this manner the transfer of the field of view in a vast range may be carried out at high speed without influence of the backrush and inertia of transfer of the specimen stage 18.

Figure 26:
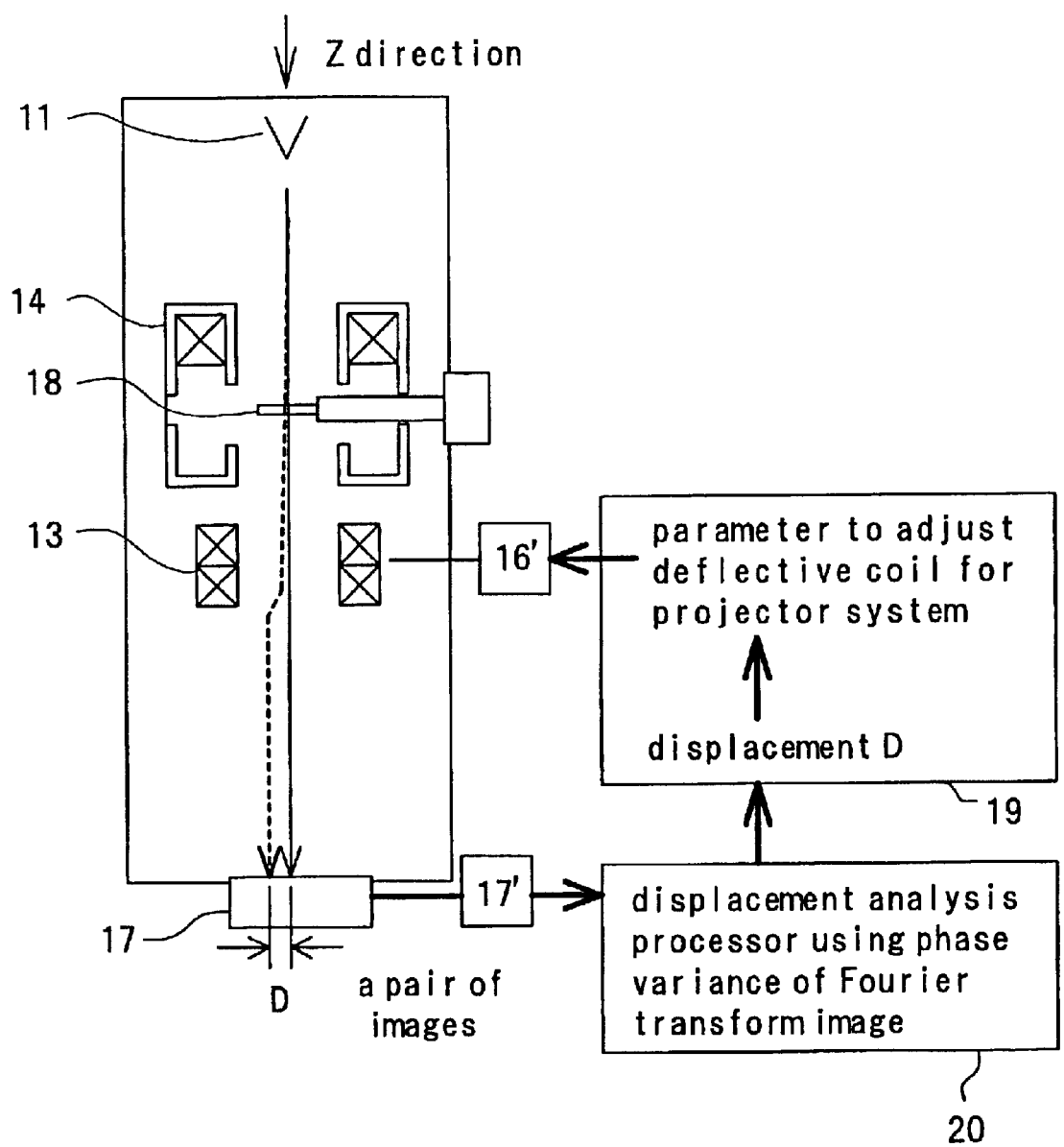
FIG. 26 shows a schematic diagram illustrating a process for automatic focusing the displacement of a specimen by the deflector coil 16 for condenser system.

The analysis may be performed in a vaster range if the position of the deflective coil for condenser system 16 is approximately constant at the moment of the beginning of inspection for each analysis area (see FIG. 18). To do this, the transfer velocity of the specimen stage 18 should be set, by calculating the time window T required for both the compensation and inspection carried out in each analysis area such that the transfer to the next analysis area by means of the specimen stage 18 may be completed before this time window T expires. The amount of image shifting by means of the deflective coil for condenser system 16 will be managed so as to be able to cancel thus decided transfer speed of the specimen stage 18. In order to match the transfer speed of specimen by means of the specimen stage 18 with the shift speed of the deflective coil for condenser system 16, the analysis of displacement in the field of view may be performed by the displacement analysis using phase variance of Fourier transform images. As shown in FIG. 26, after setting a first time and a second time, a first TEM image at the first time as well as a third TEM image at the second time will be captured by using the electron detector 17. Thus captured first and second TEM images will be transmitted to the displacement analysis processor using phase variance of Fourier transform images 20, from which the displacement D resulted by the analysis will be further sent to the computer with control software and image processing software 19. The computer 19 will compute the moving velocity of the field of view based on the displacement D to determine the parameters of deflective coil for condenser system 16, which are required for the transfer speed of the field of view to be zero, and to adjust the deflective coil for condenser system 16 based on the parameters thus determined.

It is preferable to keep constant the time T of inspection for each analysis area, since the positional precision of the specimen stage 18 is higher when the transfer speed of the specimen stage 18 is constant. Thus it is preferable to keep constant the number of images to be taken for each analysis area. Otherwise if a third TEM image for analyzing the displacement of the analysis area is taken for each of analysis areas, the precision of displacement compensation and the precision of the focusing analysis may be improved, whereas the efficiency of inspection deteriorates. Accordingly, The transfer of the field of view by using the specimen stage 18 as well as the transfer by using the deflective coil for condenser system 16 will be adjusted in the stage of adjusting the microscope prior to the viral inspection. Alternatively any analytic areas inappropriate for the viral inspection may be predefined so as not to perform focusing in the areas, but the first TEM image and third TEM image may be taken to adjust the transfer of the field of view. By assuming that the field of view in the usual analysis areas will be virtually stationary, the first TEM image and second TEM image will be taken for adjusting the focus.

Figure 15:
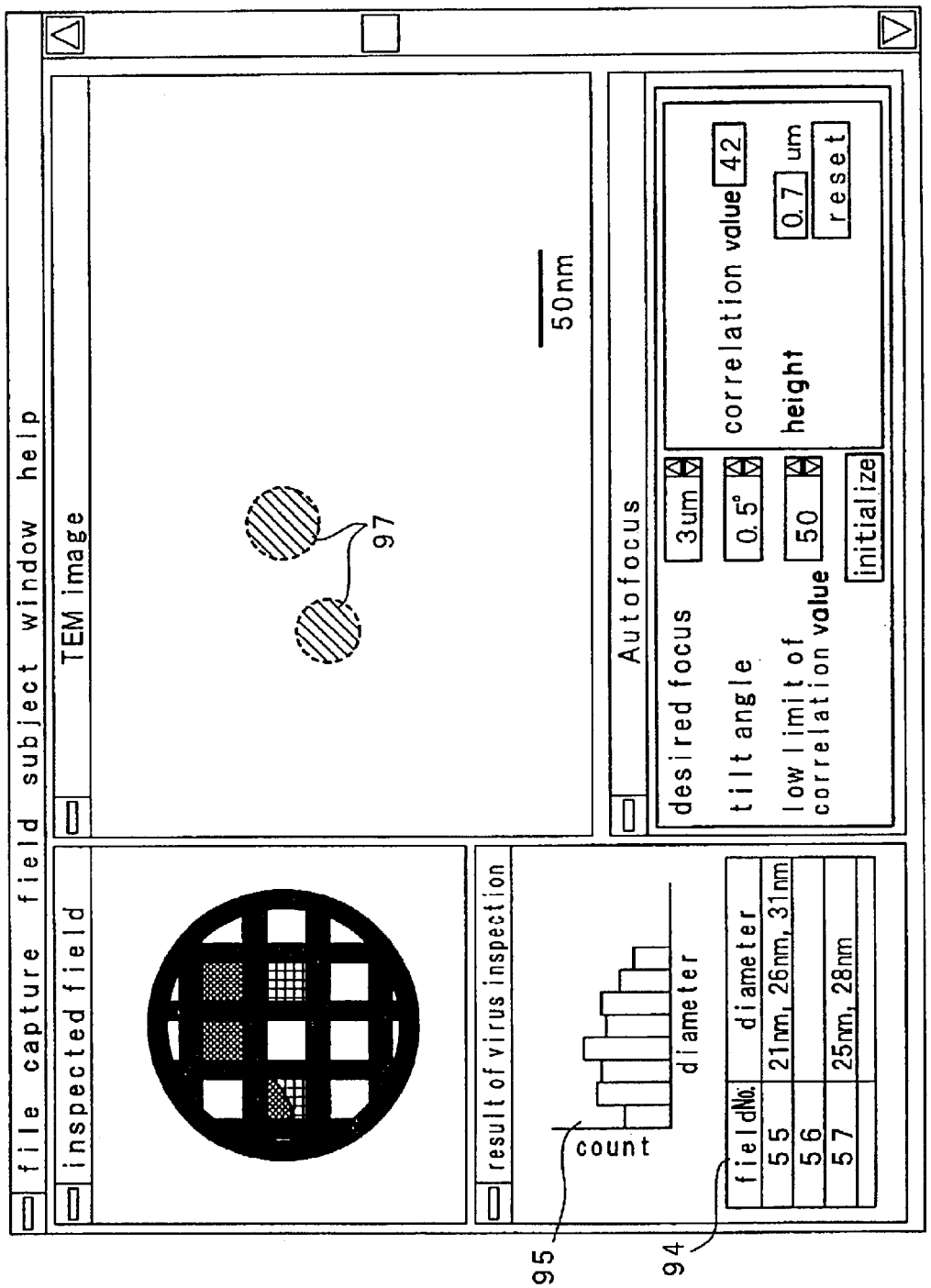
FIG. 15 shows a display screen used for setting the parameters and displaying the progress of analysis in an automatic analysis.

The items displayed in the course of inspection may be selected by the operator as required. For example, items as shown in FIG. 15 may be displayed on the screen. On the screen, the image of the analysis areas into which the image of the mesh taken 22 are divided will be displayed in a window, in which the analysis area that the inspection has been completed, area that the inspection is in progress, and area that is not yet inspected will be displayed in different colors respectively, in order for the operator to be able to make use thereof for the understanding of the progress of the inspection and for the estimation of the time of completion. There may be provided also a window showing a table 94 for sequentially displaying the result of analysis in each of the analysis area, and a histogram 95 for displaying the cumulative values of the results. Also a window for displaying the result of focal analysis may be provided, which may display the height of specimen calculated from the correlation value between the paired images and from the result of focal analysis. For the reference point of height of specimen an appropriate location in the specimen may be selected before or after inspection and that location may be specified by clicking the reset button 96. Within a window of TEM image for use of viral inspection a layer is provided for displaying circles 97 that indicates the position and the size of viruses identified. The operator who checks the results of viral inspection, focusing, and TEM image can abort that inspection if something goes wrong. The items specified by the operation among the result of viral inspection, focusing, and TEM image will be stored in the memory so as to allow the operator to display, after the inspection, the result of inspection of the analytic areas in which anomalies is prospected to be happened, based on the information such as the correlation value and the height of specimen and to confirm the inspection status.

Figure 16A:
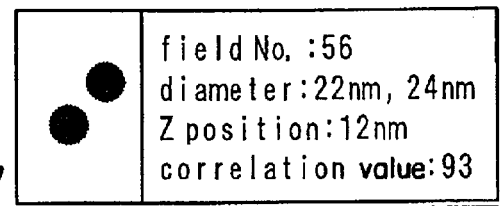
FIGS. 16A to 16D show display screen examples for displaying the results of automatic analysis.
Figure 16B:
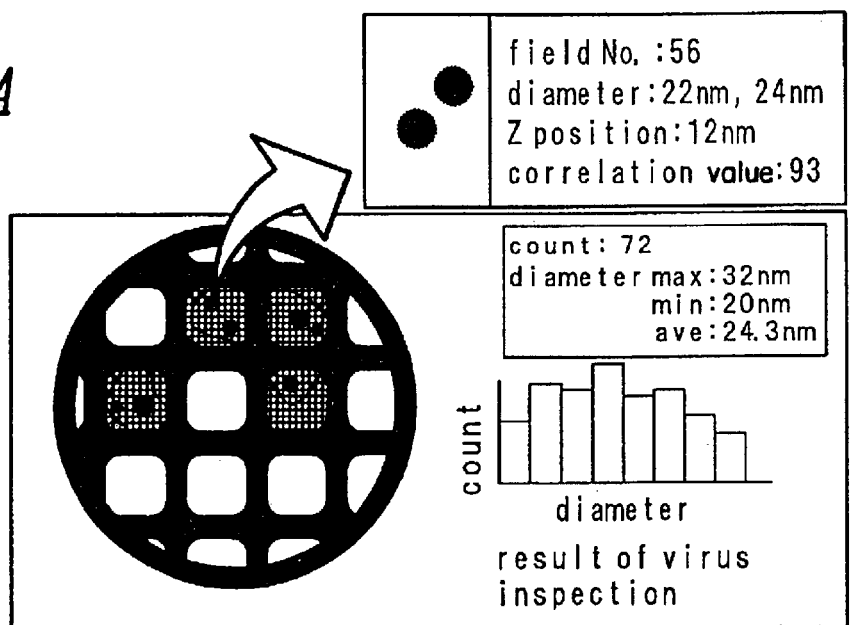

The mesh 22 is also used for the display of analytic result after the inspection. The inspected holes are divided into several areas, and the result with respect to each area may be displayed as black and white or in full color in accordance with the selection of displayed items. For instance, when the operator selects the number of viruses for the display item, each area will be colored in accordance with the number of viruses, as shown in FIG. 16B. The TEM image taken for each of analysis areas may be shown on the screen by for example specifying the number of area in interest, or by double clicking on the spot of the analysis area. Among items stored in the memory, only the items specified by the operator will be displayed on the screen. For example, the result of viral inspection in that area in interest, the height of specimen, the correlation value may be displayed along with the TEM image display (FIG. 16A).

Figure 16C:
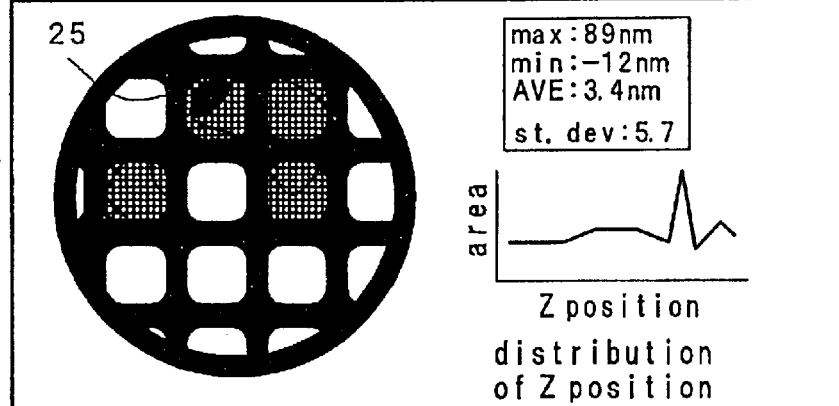
Figure 16D:
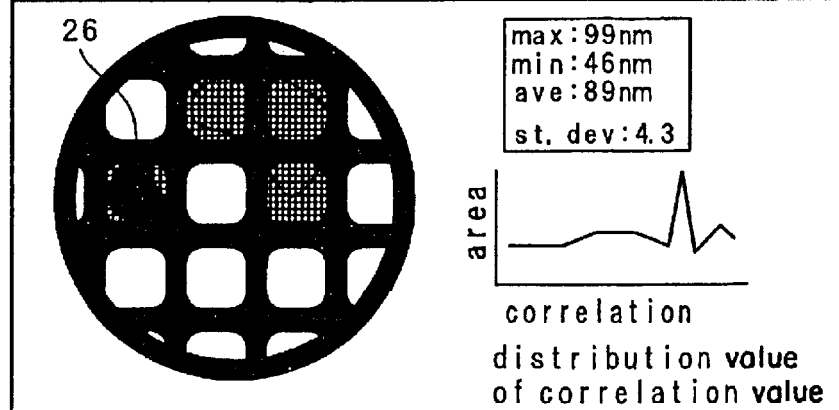

The distribution chart of the height of specimen and the correlation may be used for outlining the inspection status and for evaluating the reliability of the inspection result. Since biological specimens are in general sliced into thin sections of thickness of about tenth nanometers, which may be considered to be almost flat. The change of the height of specimen may be caused by the curved or inclined mesh that mounts the specimen. When plotting the distribution of the height of specimen the distribution of height should form a curved surface of the kind relatively smooth. If the height of specimen changes abruptly, then it can be concluded that either an incorrect operation occurred in the focusing analysis of that area, or the sectioned specimen was blown up for some reason. In either case, the reliability of the result of inspection of the analysis area in question is not sufficient. For example, when considering the distribution of the height of specimen as shown in FIG. 16C, as the height of specimen in the region 25 is different from other regions, it can be concluded that the reliability of the result of inspection in the section 25 is not eligible. In order to remove the result of analysis in this region, the setting may be configured so as no to use the result of analysis in any analytic area out of specified range of the height of specimen. This means that the distribution of the height of specimen may be used as a sort of filter applied to the result of analysis. Alternatively, instead of configuring a filter based on the height of specimen, the curvature obtained from the distribution of height may be used for configuring a filter. When a distribution of correlation as shown in FIG. 16D has been obtained, this correlation may be also used for the evaluation of the sharpness of TEM images. In case of biological specimens, if the section of sliced specimen is thick, even images observed at the optimum focus will be blurred. With blurred images the correlation will be degrades and the error encountered at the time of binary coding will be larger so that the precision of measurement of the diameter of viruses will be lowered. By using the distribution of correlation as a filter, in a similar manner to the distribution of the height of specimen, the analysis result in the region 26 having a lower correlation than others may be eliminated. By estimating the measurement error of the viral diameter based on the correlation values, the measurement error may be used as a weighting function when creating a distribution chart of the diameter of viruses.

[Third Embodiment]

FIG. 19 shows a fundamental arrangement of a transmission electron microscope (TEM) for use in an embodiment in accordance with the present invention. The TEM is comprised of an electron gun 11 and electron gun control circuit 11', a condenser lens 12 and condenser lens control circuit 12', a deflective coil for condenser system 13 and deflective coil control circuit for condenser system 13', an objective lens 14 and objective lens control circuit 14', a projector lens 15 and projector lens control circuit 15', a deflective coil for condenser system 16 and deflective coil control circuit for condenser system 16', an electron detector 17 and electron detector control circuit 17', a specimen stage 18 and specimen stage control circuit 18', and a computer with control software and image processing software 19. Each of control circuits may receive control commands sent from the control software in the computer 19, perform controls and return the return value to the computer. The electron detector 17 is a detector constituted of a plurality of pixels such as a CCD camera, which may transmit signals of obtained images through the cable for image transmission to the storage device of the computer 19 or to the displacement analysis processor using phase variance of Fourier transform images 20. The displacement analysis processor using phase variance of Fourier transform images 20 is connected to the computer with control software and image processing software 19.

FIG. 3 shows a flow chart of TEM imaging. An acceleration voltage is applied to the electron beam that is the first charged particle beam generated by the electron gun 11, then the deflective coil for condenser system 13 as a deflector means is used for adjusting the deflection of beam such that the electron beam passes through the optical axis, to verify that the electron beam reaches to the electron detector 17. After adjusting the condenser lens 12, a specimen 21 is set into the TEM, and a TEM image at lower magnification rate is observed. The objective aperture is inserted to the optical axis in order to increase the contrast of TEM image. By gradually increasing the magnification of the projector lens 15, an observation field is selected and the focusing is adjusted to take TEM images as required.

To the analysis of focusing in the above focusing step is applied a focusing analysis method using parallax. In this method a first TEM image obtained by an electron beam emitted at first incident angle in almost parallel to the optical axis, and a second TEM image obtained by an electron beam emitted at second incident angle descend to an angle $\alpha$ from the optical axis are used. A functionality for deliberately changing the irradiating angle of the electron beam into the specimen by using the deflective coil for condenser system 13 as shown in FIG. 19 is called a wobbler, which may be used for transform an amount of defocus into a parallax. Now referring to FIG. 24, the principal of operation of the wobbler and the mechanism of occurrence of parallax will be described below in greater details. In FIG. 24(a) there is shown an optical geometry in case that a specimen is just placed at the focal plane (F=0), and the electron beam is emitted in parallel to the optical axis of the system ($\alpha$=0). In the figure the electron beam is emitted to the specimen (shown as an arrow) in a direction from the top toward the bottom of the drawing. Part of electron beam will be diffracted within the specimen. For instance in case of a crystalline specimen the electron beam will be dispersed to a specific direction which may satisfy the Bragg's rule, and the rest thereof will be transmitted through the specimen without changing the direction. The objective lens placed below the specimen may have the characteristics similar to any ordinary optical convex lens, and act to collimate the electron beam. The electrons diffracted to the same direction will be converged to a point below the lens; the converged electrons forms so-called the diffraction plane (back focal plane). Below the diffraction plane the electrons diffracted and transmitted at an identical point will be converged to form the TEM imaging plane. At the TEM focal plane, the size of the specimen is magnified by M times, depending on the projection magnification rate M of the objective lens. If F=0 and $\alpha$=0, then the image of the arrow is correctly focused at the TEM image plane as shown in FIG. 24(a), without displacement from the optical axis (c.f., D=0). If otherwise the specimen is placed at the focus position (F=0) but the electron beam is tilted by an incident angle $\alpha$, as shown in FIG. 24(b), by means of the wobbler, then the electron beam will be subjected to collimate to another focal position, displaced from the axis of the objective lens. This may result in a displacement of field of view, $D = Cs\ M\ \alpha^3$, because of the influence of the spherical aberration which is intrinsic to the convex lens system as similar to the optical lens, where Cs designates to a spherical aberration index which is an intrinsic value of a specific lens. If otherwise the specimen is not at the focal position and the electron beam is tilted by an incident angle $\alpha$ by means of the wobbler, then the amount of displacement will be worsen as shown in FIG. 24(c). At the amount of defocus F, the position of specimen will be shifted by an amount a F to the direction normal to the optical axis the image at the TEM imaging plane will be magnified by the magnification rate M of the lens to result in a parallax M $\alpha$ F. Thus the total amount of parallax together with the displacement due to the spherical aberration will become an amount indicated by $D = M\ \alpha\ (F + Cs\ \alpha^2)$. It can be clearly seen from this equation that, the parallax D will be zero if $\alpha$=0, irrelevant whether the specimen is place at the focal position or not. By using the wobbler in such a manner as described above when photographing two pairs of images which have different $\alpha$ each other, the amount of defocus F may be specifically identified based on the amount of displacement D in the paired images. The parallax due to the aberration (Cs M $\alpha^3$) is fewer than the parallax due to the defocus (M $\alpha$ F) in the order of one figure or less. Therefore by minimizing the parallax a focus compensation at higher precision may be achieved. The focusing using the wobbler may be considered to be completed if the parallax becomes less than Cs M $\alpha^3$.

The displacement D in the paired images may be given by using the displacement analysis using phase variance of Fourier transform images.

FIG. 5 shows a schematic diagram describing the displacement analysis using phase variance of Fourier transform images. Assuming that a pair of images S1 (n, m)=S2 (n+dx, m+dy) has the displacement D=(dx, dy), and the two dimensional discrete Fourier transform of S1 (n, m), and S2 (n, m) is S1' (k, l), and S2' (k, l). In accordance with an equation of the Fourier transform, F {S (n+dx, m+dy)}=F {S (n, m) } exp (idxk+idyl), the pair of images may be expressed as S1' (k, l)=S2' (k, l) exp (idxk+idyl). The displacement D of S1' (k, l), and S2' (k, l) may be expressed by a phase variance exp (idxk+idyl)=P' (k, l). Since P' (k, l) is a wave with the cycle (dx, dy), then in an image P (n, m) which is subjected to invert Fourier transform of a phase variant image P' (k, l), a $\delta$ peak will be appeared at the location (dx, dy). Since it can be assumed that in the image P (n, m) only the $\delta$ peak may be present, the computation of the center of gravity of the intensity of $\delta$ peaks allows the correct determination of $\delta$ peak even if a fraction is present in the position of $\delta$ peaks.

When the peak intensity δ is computed after normalizing the intensity of the entire image P (n, m), the intensity will be weaken if the unmatched area in the pair of images is larger, in other words, if the noise increases. By expressing the peak intensity as the correlation value the match between images in the pair may be evaluated.

Figure 25:
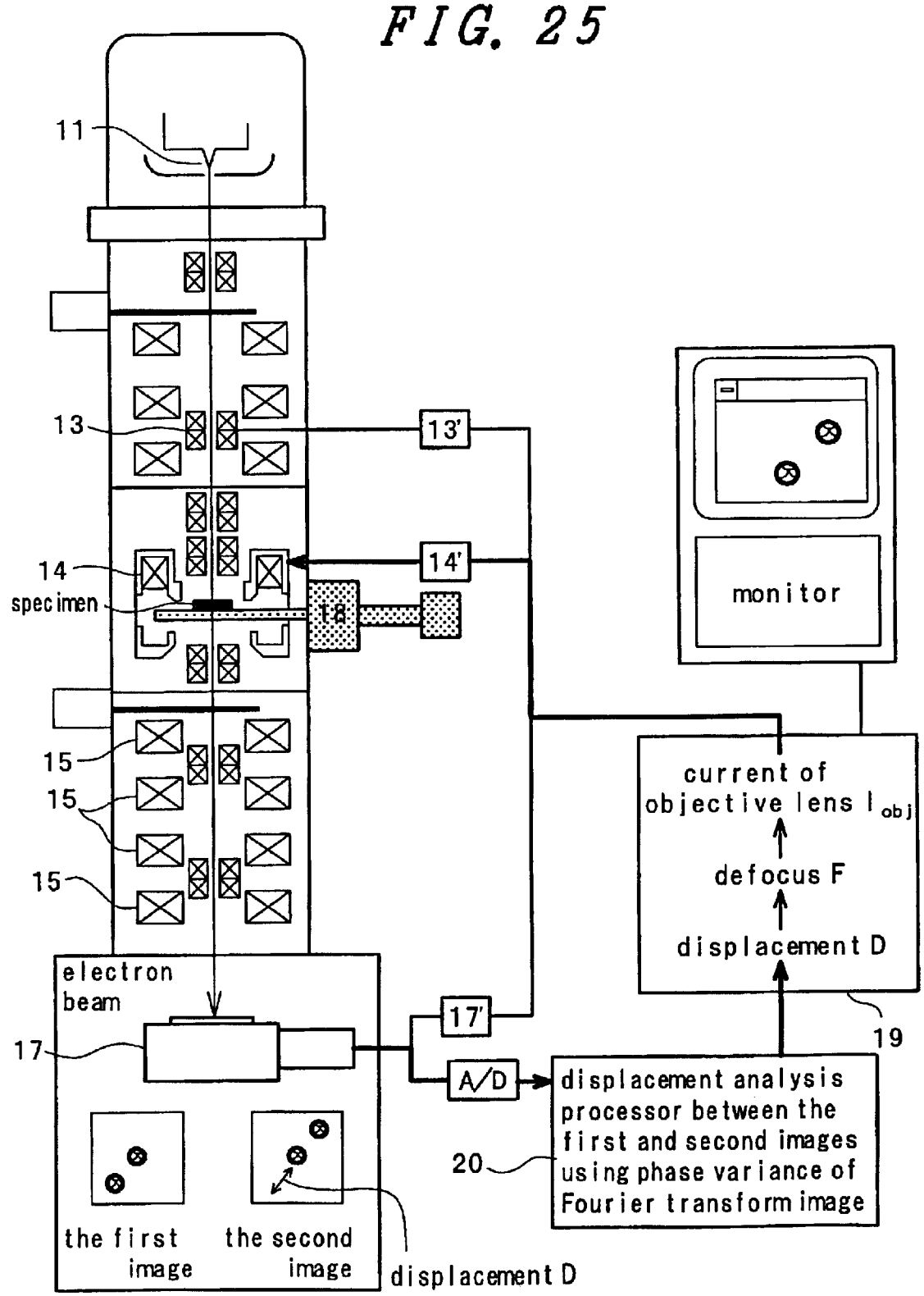
FIG. 25 shows a schematic diagram illustrating a process for automatic focusing using the parallax.

By using the apparatus as shown in FIG. 25, focusing will be carried out in accordance with the flow chart shown in FIG. 9. At the beginning, a field of view on which focus will be analyzed will be selected by the fine-tuning mechanism of the specimen provided by the specimen stage 18. The selection of a field of view includes also the setting of magnification rate of the observation and of objective aperture. Then the display shown in FIG. 2 will be used to set the optimal focus, lower correlation threshold, tilt angle α, and repetition of compensation. Once the parameters are set, a pair of images may be taken by using the electron detector 17. From a pair of images captured, an analyzing image P (n, m) will be derived to identify the peak corresponding to the displacement. Thus derived displacement D will be further sent to the computer with control software and image processing software 19. The computer 19 will compute the focus F by means of the relation $D=M \alpha (F+Cs \alpha^2)$, and the current of the objective lens $I_{obj}$ to be adjusted corresponding to the focus F, then send this value to the objective lens control circuit 14' to carry out the adjustment of the current of the objective lens.

Figure 20:
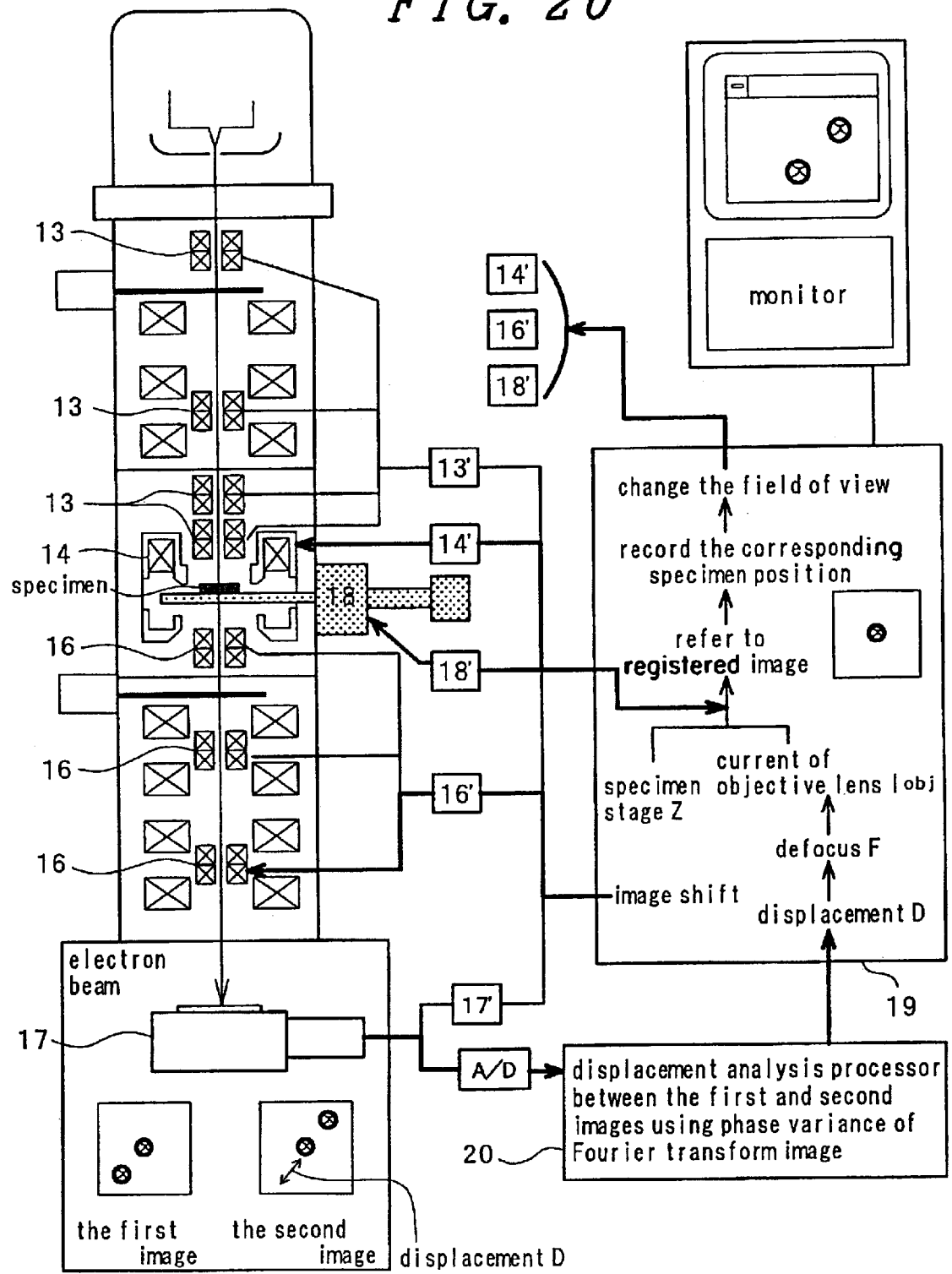
FIG. 20 shows a process of viral analysis using the TEM.

In this embodiment, exemplary inspections of virus or semiconductor memory using an electron microscope implementing the focusing compensator as have been described above will be described below. Since an electron microscope has a capability of resolution in the level of atoms, may obtain a range of contrasts in accordance with the structure of the specimen, a variety of observations is performed in biological as well as non biological fields. In case of viral inspection, the viruses, such as AIDS and Influenza, which are too small to be identified by an optical microscope, should be identified in shorter times, to determine whether viruses is present or absent, and to diagnose whether the infection is present or absent for a number of patients. In such a situation, heretofore, the operator of electron microscopy inserts the specimen by hand to the electron microscope operating in manual mode to evaluate by naked eyes. The inspection of semiconductor memory is another example. A specimen, which was picked up in an appropriate manner and processed to the shape suitable for observation will be set to an electron microscope and observed. Since the density of integration in recent years is increasingly becoming higher than ever and the number of field of view to be observed is increasing more and more, it is nearly impossible for an inspector to manually find every defect. In addition, since most of specimens are not made flat, and are not always placed in a plane perpendicular to the electron beam, the focusing point will be gradually shifted when the field of view is continuously transferred one after another, so that the focusing should be done each time. Accordingly, the throughput of the observation by means of automatic control of the inspection process is being a matter of utmost concern. An example of viral inspection in accordance with a preferred embodiment of the present invention will be described below in greater details, with reference to FIG. 20, using the functionality of automatic focus compensation in accordance with the present application. Similarly to the first embodiment above, the displacement D will be calculated from a pair of taken images to derive the amount of defocus F and the current of the objective lens $I_{obj}$ corresponding thereto. Based on these parameters the objective lens will be immediately readjusted. Thereafter another image will be taken. Otherwise the image for inspection will be taken after repeating the fine adjustment of specimen and the focusing for several times until the target field of view will be seen on the image. The comparison with the image registered for the reference with respect to the viruses to be extracted will be performed thereafter.

Also in this preferred embodiment, similar to the analysis of the displacement D, the consistency of the shapes will be evaluated by using the displacement analysis based on the phase variance of two Fourier transform images to derive the correlation value to determine that the virus is found therein when the correlation value is less than the predetermined lower correlation threshold (limit). In this case either the x and y coordinates of the specimen stage 18 on which the viruses have been found or the specimen number will be stored. If no virus is found in the field of view then the field of view will be shifted to the next. To do this each fine tuning mechanism for x-, y-, z-axis respectively attached to the specimen stage 18 may be used to move it to change the field of view, or alternatively the deflective coil for condenser system 16 may be used to transfer the position of electron beam. Alternatively the fine adjustment mechanism may be provided at the attachment of the electron detector 17 to the electron microscope to move the electron detector 17 itself. As can be recognized by those skilled in the art, the compensation for the transition and drift of the position of specimen evidently means displacing the position of the electron beam detector relative to the irradiation point of the electron beam transmit through the specimen, therefore the most suitable solution may be chosen in accordance with the context. There are also a plurality of solutions for the focusing compensation. In the preferred embodiment as have been described just above, the compensation for focusing may be carried out by adjusting the current of the objective lens to change the focal distance, however, the compensation alternatively may be performed by detecting the amount of displacement D to finely adjust accordingly the position of specimen by means of the specimen stage 18 such as in the direction of incident axis of electron beam in case that the specimen has been located at the focal position. This alternative solution is just like that as shown in the flow in FIG. 20 the specimen stage is transferred into the direction of z axis after calculating the amount of defocus F. In case of a drifted specimen either the specimen stage 18 may be moved, or the mounted position of the electron detector 17 may be fine-tuned in correspondence with the amount of displacement D in the plane perpendicular to the incident direction of the electron beam.

Figure 21:
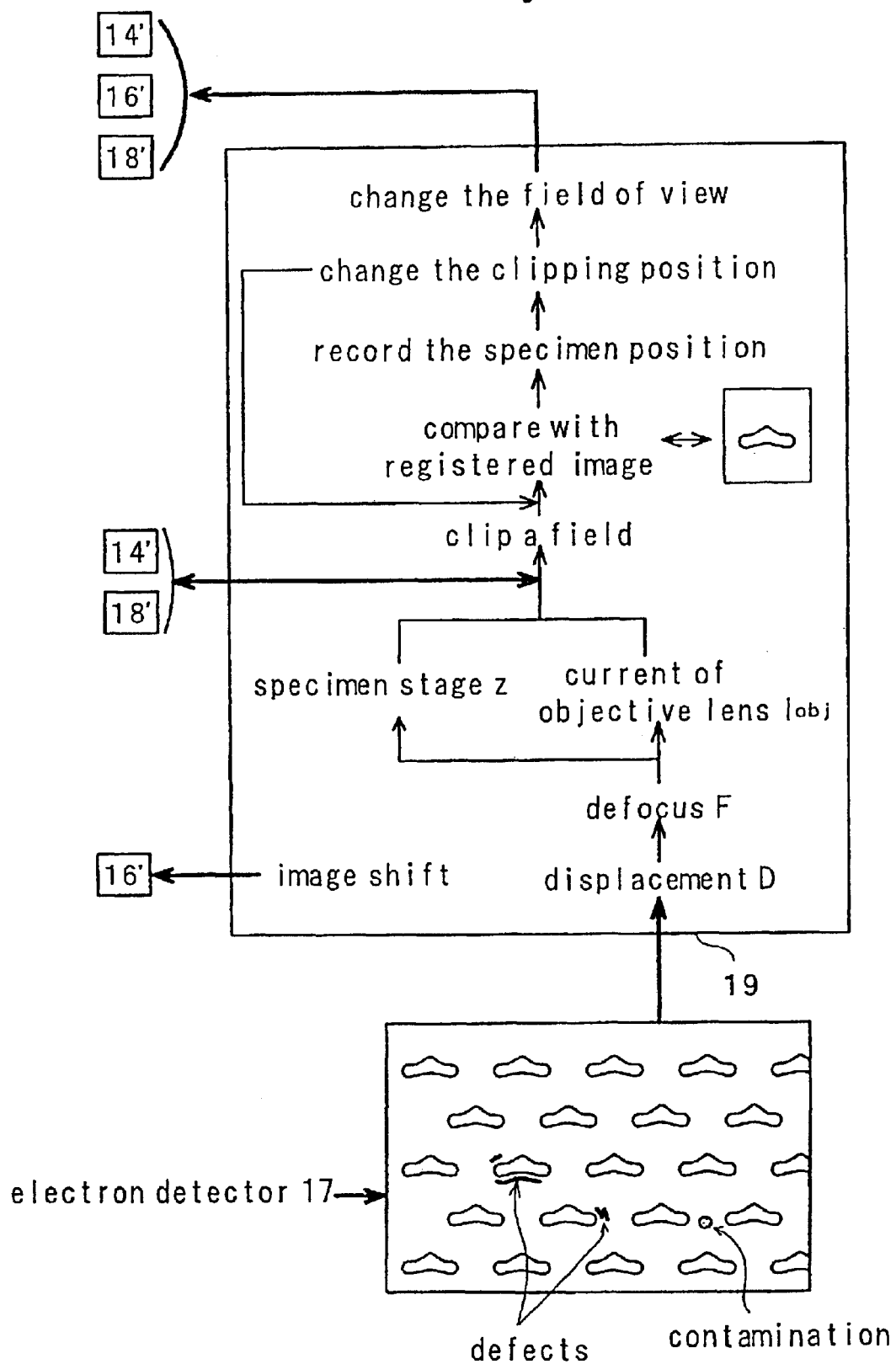
FIG. 21 shows a process of evaluation of semiconductors using the TEM.
Figure 22:
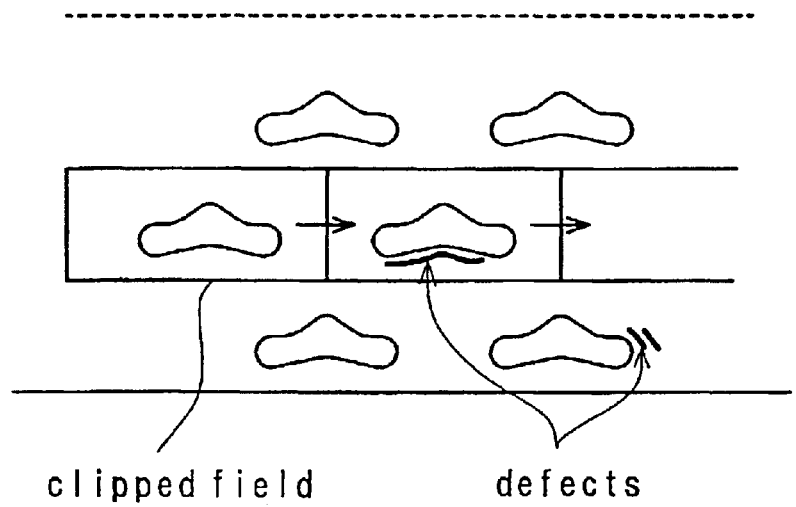
FIG. 22 shows a process of trimming from an TEM image patterns subjected to be inspected and of comparing one with another thereof.
Figure 23:
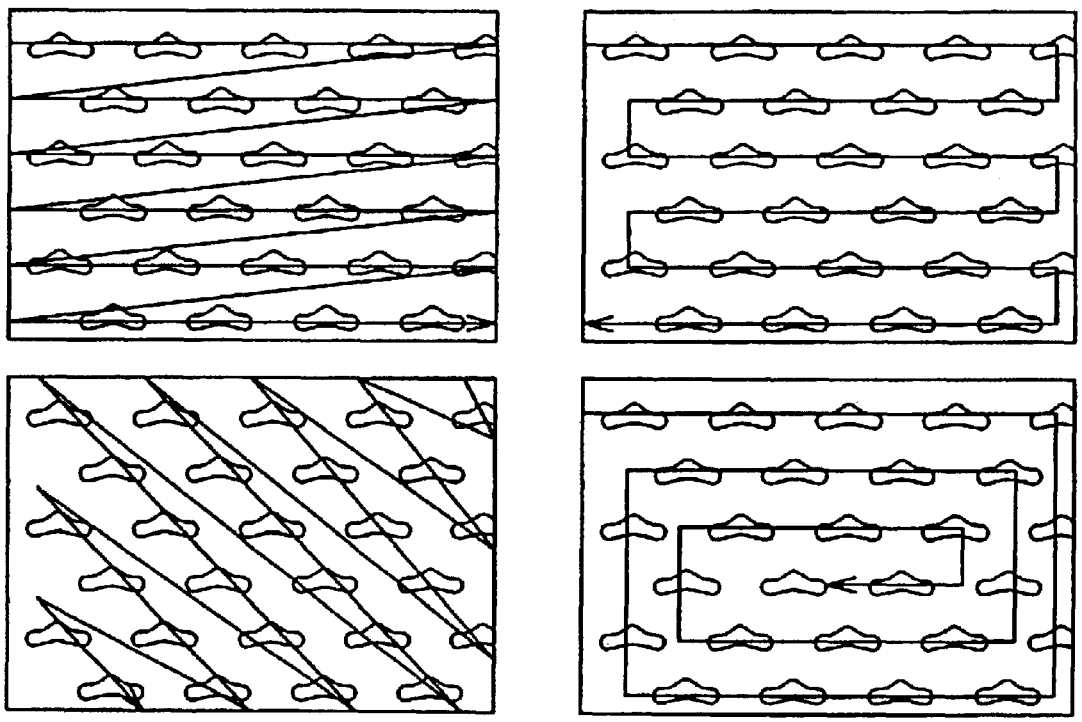
FIG. 23 shows a sequence of analysis when shifting inspection field by means of the specimen stage 18 or deflector coil 16 for condenser system.

Next, referring to FIG. 21 an example carrying out the preferred embodiment in accordance with the present invention will be described below in greater details. An image (plan view) of an exemplary memory cell, observed from above thereof, transmit from the electron detector 17 is as shown in the figure. In most cases the semiconductor chip is consisted of a number of regular iterative arrays of a given pattern of shape as shown. A contrast anomaly caused by for example a defect or contamination debris may be included in part thereof. In FIG. 21, there are shown defects like line segments and a round contaminant. At first the focusing may be adjusted as have been described above, and then the field will be compared with a registered pattern. An example of comparison scheme will be described with reference to FIG. 22. By making use of regular pattern in the arrays to be inspected, the field of view will be clipped to the size of an elementary pattern. In this situation the same size of image will be suitable for the registered image to be compared with. Similar to the viral inspection as above, the consistency of the pattern will be evaluated, and if the correlation value falls below a predetermined lower threshold the corresponding address of memory will be recorded. Thereafter the position of clipped field of view will be shifted to the next to iteratively evaluate the consistency of the pattern. Once the inspection of the entire image captured has been completed, the field of view will be changed by means of for example the specimen stage 18 or the deflective coil for condenser system 16 and the focus will be readjusted to resume the inspection. In the foregoing description there are a plurality of patterns of memory cells in the image captured by the electron beam detector at the beginning, however, it may be possible that the defects to be detected may be much smaller, or the contrast of the image may be much lower. In such a case it may be required to increase the magnification rate to a level sufficient to the observation. To do this an image of just one memory cell will be taken with a higher magnification rate to compare one by one with the registered image without clipping. In FIG. 22 the field of view moves from left hand side to the right hand side on the drawing sheet. However, any other sequences are equally allowed, and some examples are shown in FIG. 23.

The sequence should be chosen in accordance with the performance of the fine adjuster of the specimen stage and the precision of deflection of the deflective coil used.

In this specification some embodiments by means of a transmission electron microscopy (TEM) have been described by way of examples, however, the technology disclosed in the present invention may be equally applied to any other type of inspection apparatus for viewing images by using charged particle beams such as electrons and ions, including electron microscopes, such as scanning electron microscopes (SEM), scanning transmission electron microscopes (STEM), scanning ion microscopes (SIM).

[Forth Embodiment]

In an apparatus for observing or inspecting a specimen by continuously moving the specimen stage, the transfer of specimen stage at a predetermined constant speed may become difficult if the transfer speed is faster than 5 m/sec due to the error caused by the vibration, inconstant speed, and the precision of transfer rails. This problem can be solved by the application of the present invention, by using a first charged particle beam as the probe to probe the specimen to detect a second charged particle beam emitted from the specimen to compute the error of the current position of the specimen stage with the target position thereof by using the phase limitation from a plurality of images thus obtained to feed back the result to the specimen stage or to the deflector which deflects the probe before the next image of the specimen to be inspected in next turn will be captured. This allows onset of erroneous judgments in the inspection of continuously moving specimen to be decreased.

More specifically, The probe, first charged particle beam will be collimated to scan a predetermined area on the specimen through the deflector and objective lens, then the second charged particle beam emitted from the specimen will be detected by the detector, and the detected signals will be converted from analog to digital domain to store in a storing means. The starting point of recording will be held at a given constant position for every sessions and the scanning will be started over again at timing management signals or signal from the specimen stage or the marking on the specimen. At a predetermined period of time after the capture of first image, a second image will be captured. These first and second images will be subjected to the Fourier transform to determine the phase variance therebetween and will be subjected then to the invert Fourier transform to determine the displacement from the origin based on the distance of address in the storage means to feed the result back to the controller of the specimen stage or to the deflector. The error found in comparison of the first image with the second image, due to the malfunction or incorrect operation during transfer of the specimen stage will be decreased.

[Fifth Embodiment]

Figure 27:
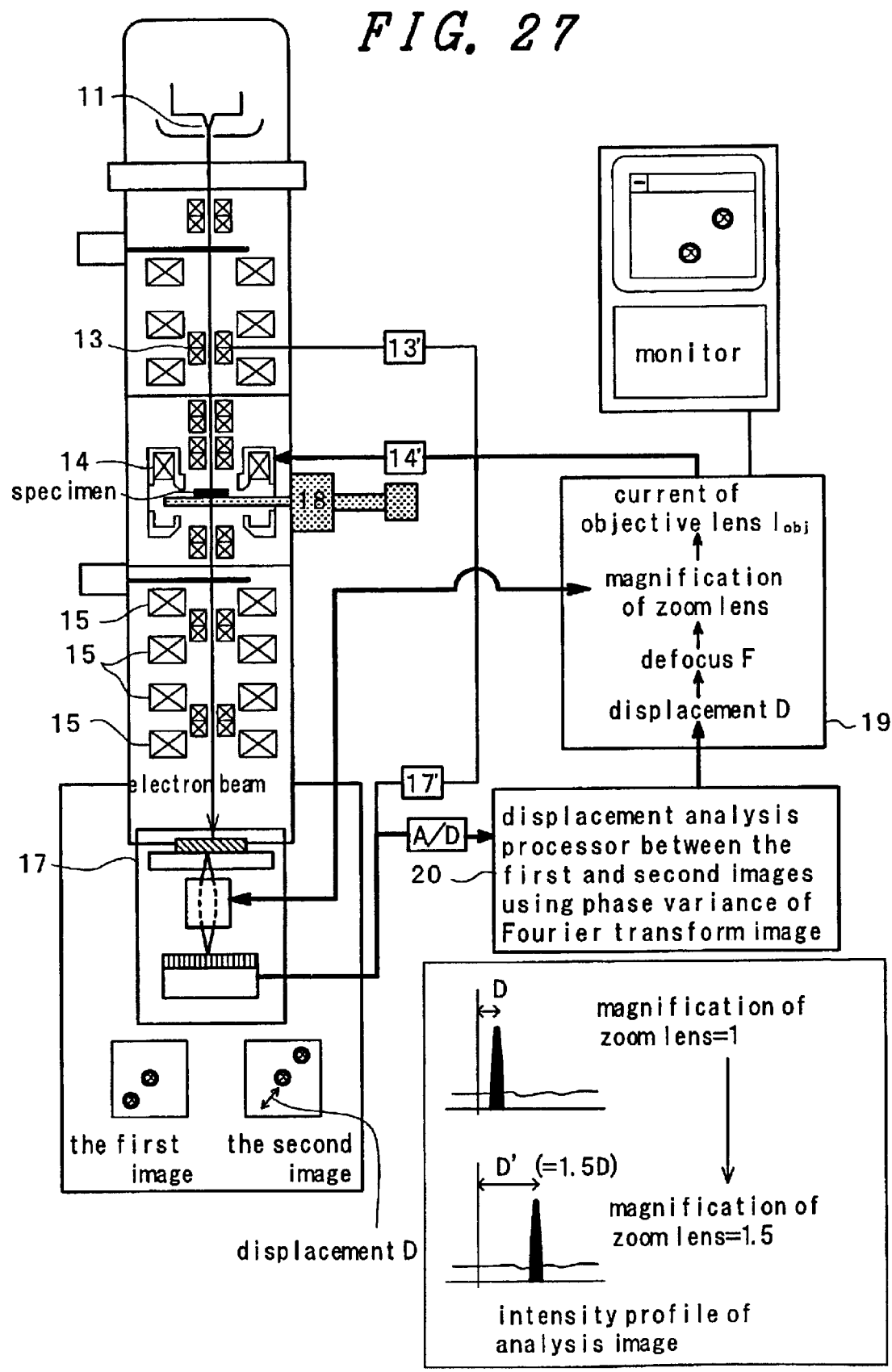
FIG. 27 shows a schematic diagram illustrating a process for improving the precision of displacement analysis of a specimen by using a zoom lens system.

In the first embodiment described above, an example using a CCD camera as the imaging device has been disclosed. The fundamental configuration of the CCD camera used is comprised of a scintillator 71, a photo coupler 72, and a CCD camera 73, as have been described above with reference to FIG. 6. The images formed on the scintillator 71 will be focused on the CCD camera 73 at a constant magnification rate of projection. In this embodiment, an example using a zoom lens for the photo coupler 72 to variably set the magnification rate of projection in compliance with the analytic result of the displacement will be described below, with reference to FIG. 27. At the bottom part of the electron microscope is mounted a electron detector 17 in a manner similar to FIG. 19. The detailed configuration is shown in the figure. The electron image made of electron beam will be converted to optical image by the scintillator 101 placed in a vacuum. The scintillator 101 is adhered on a glass substrate 103, is polished to the most suitable thickness, for example approximately 50 to 120 microns in combination with the accelerated electron beam at 100 kV to 400 kV. The optical image formed by the scintillator 101 will be focused on the imaging device 106 through the optical lens 105. The optical lens 105 and imaging device 106, which are devices of precision structure, are preferably placed and operated in the atmosphere. In other words only the scintillator 101 is installed in the vacuum by using a vacuum seal 102, the optical image will be picked up to the atmosphere through the glass substrate 103 which separates the vacuum and the atmosphere. For the imaging device 106 a vast majority of two dimensional detectors including not only the CCD device but also any imaging devices such as camera tubes. The procedure used for determining the amount of defocus F corresponding to the displacement D between the first and second images is identical to the first embodiment described above. In general, the smaller the amount of defocus F is, the smaller the displacement D between two images. Thus in order to find the amount of displacement D at a higher precision, an effective way is to increase the magnification rate of imaging when the displacement D decreased to less than a given limit to enlarge the displacement. To increase the magnification rate of imaging, it will be sufficient to increase the magnification rate of the electron microscope. However, there may often be arisen undesirable effects, such as the change of the field of view, change in the image contrast resulting from the change of conditions of electron beam optics. Therefore the inventor have devised a method for changing the magnification rate of imaging without touching the electron microscopy, by changing the magnification of the zoom of the optical lens 105. Any zoom lens 105 commercially available in the market equipped with motor-driven zooming mechanism may be used for the optical lens 105. As shown in the box at the right hand bottom corner of the drawings, the magnification of zooming of the optical lens 105 may be increased to for example 1.5 fold when the peak indicating the displacement D is approaching to the origin. If two images at this condition are taken again, a displacement D' will be magnified to 1.5 fold accordingly. As can be seen from the foregoing description the compensation of focusing as well as drifting may be enabled at higher precision by feeding the result of analytic images back to the election detector 17.

[Sixth Embodiment]

Figure 28:
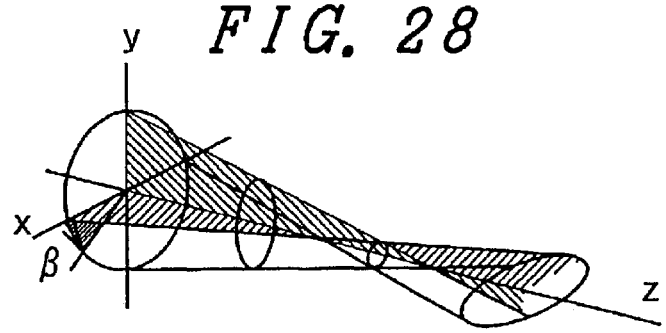
FIG. 28 shows a schematic diagram illustrating the focal distribution around the optical axis in an electron beam astigmatic lens.

In the first preferred embodiment above a focus compensation using the parallax has been descried. A stigmatizer, compensator for astigmatic aberration using the parallax may also be achieved. An astigmatism is a phenomenon that, as shown in FIG. 28, the focus is distributed to an oval around the optical axis because the electromagnetic field generated by the objective lens 14 has an oval distribution around the optical axis (z-axis). In other words the focus has a distribution described by $F(\beta)=F+A\cos^2(\beta-\beta A)$, depending on the azimuth $\beta$. In this equation F designates to the mean of $F(\beta)$, referred to as the amount of defocus in general the A designates to the amount of astigmatism, and $\beta A$ to the astigmatic orientation.

Figure 29:
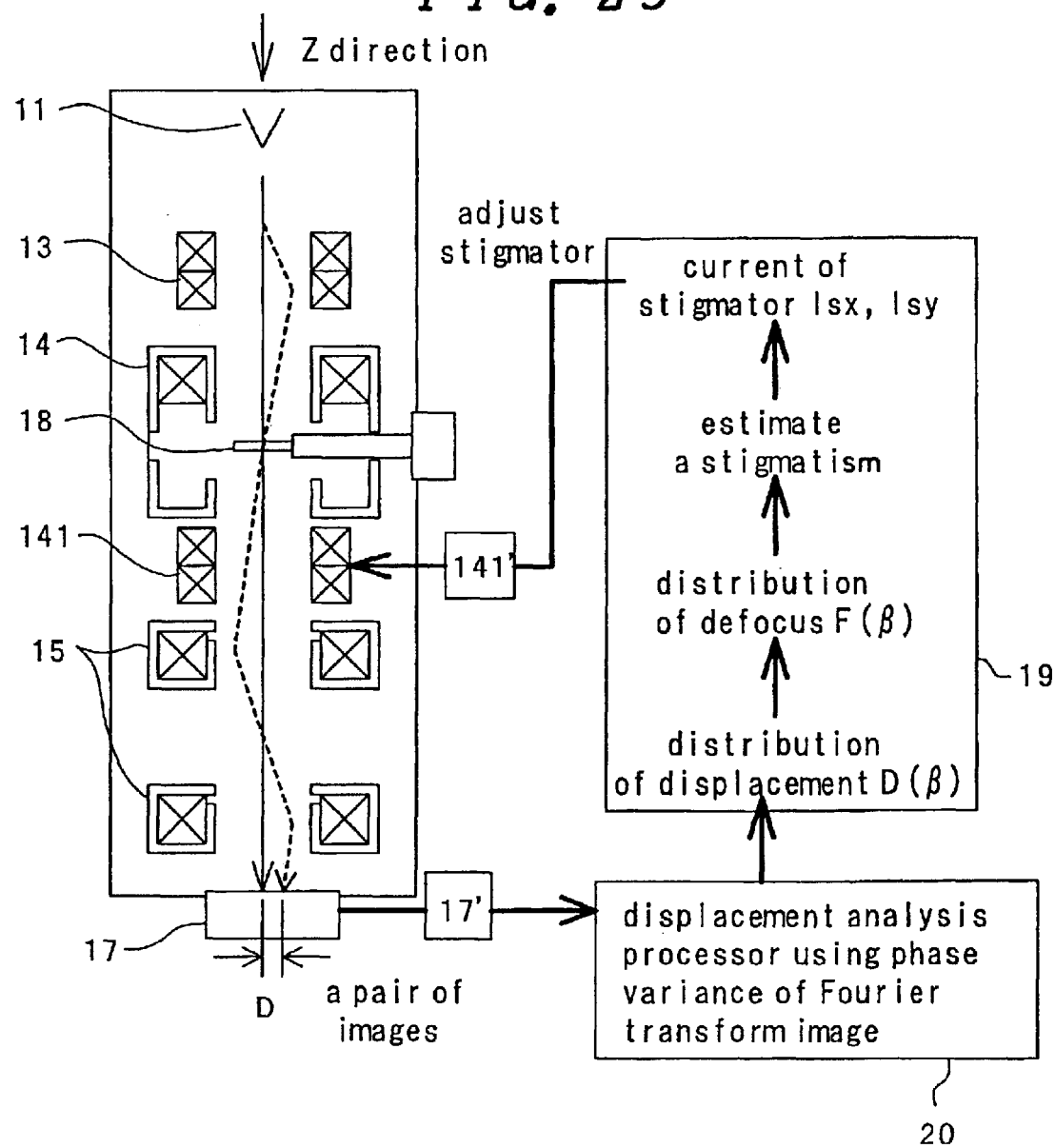
FIG. 29 shows a schematic diagram illustrating a process for compensating for astigmatism in an electron microscope.

The apparatus and the process flow depicted in FIG. 29 may be used to find the focus distribution around the optical axis by the focus analysis using the parallax to analyze the amount and orientation of astigmatism to feed the result back to the stigmatizer 141. A first TEM image will be taken by irradiating the specimen with the incident electron beam from a first direction approximately in parallel to the optical axis, the z-axis, and a second TEM image will be taken by irradiating the specimen with the incident electron beam from a second direction tilted by an angle $\alpha$ from the z-axis. The azimuth of the second direction with respect to the x-axis will be $\beta_2$. The displacement $D(\beta_2)$ between the first TEM image and the second TEM image will be analyzed by the displacement analysis processor using phase variance of Fourier transform images 20, which will in turn send thus found displacement $D(\beta_2)$ to the computer 19, which further will computes the amount of defocus $F(\beta_2)$ at the azimuth $\beta_2$. Thereafter, a third TEM image will be taken by irradiating the specimen with the electron beam from a third direction where the direction is tilted by angle $\alpha$ from the z-axis, and the azimuth to the x-axis becomes $\beta_3$, in order to analyze the displacement $D(\beta_3)$ between the first TEM image and the third TEM image to determine the amount of defocus $F(\beta_3)$ at the azimuth $\beta_3$ to the x-axis. Then the same procedure of analysis will be applied to a plurality of azimuths $\beta_n$ to determine the distribution of azimuth at the focal point.

Any one of fitting methods including such as least-square method will be used to identify the amount of defocus, astigmatism, and the astigmatic orientation from the focal point $F(\beta_n)$ at each orientation. With respect to the astigmatic orientation there may be a case in which the azimuth of incident electron beam may not be in parallel to the direction of displacement vector, by the influence of image rotation being generated within the electron lenses. Since the difference between the orientation of incident electron beam and the direction of displacement vector may be determined once conditions of lens such as the magnification rate has been decided, the difference at each of lens conditions may be stored in the computer to correct the astigmatic orientation based on the stored difference.

Based on the result of the astigmatism analysis, the current values I sx and I sy of the stigmatizer 141, required in order for the amount of astigmatism A to become zero, will be computed so as to adjust the stigmatizer 141 through the stigmatizer control circuit 141'.

The astigmatic analysis needs a precision by two digits or more superior to the precision of defocus analysis. In a conventional focus analysis system using the cross-correlation for the analysis of displacement it will be very difficult to satisfy a precision required to carry out the stigmation. The analysis of astigmatism is an analysis of focal distribution, so that a large number of times of displacement analysis will be required. The system disclosed herein, equipped with the displacement analysis processor using phase variance of Fourier transform images 20, based on a digital signal processor (DSP), may perform one focusing analysis within a second, allowing one analysis of astigmatism to be completed within a few seconds.

The performance of apparatus compensating for an electron microscope based on the displacement between the images taken by the electron microscope such as the focusing analysis using the parallax is largely depending on the displacement analysis. In the analysis method of displacement used in the conventional compensator systems the precision of analysis in theory cannot be smaller than the size of a pixel of the electron detector 17. However, in accordance with the present invention, a precision of analysis smaller than the size of a pixel may be obtained. The apparatus in accordance with the present invention is capable to adjust the focusing at a precision as fine as a skillful operator. Although the time required for analysis and the cost of hardware will be increased when improving the performance in an attempt to improve the precision of focal analysis, such as subdividing the image to be inspected into still smaller pieces, the present invention, which may improve the precision of the analysis of displacement by altering the analysis method of displacement, allows the precision of focusing analysis to be improved without additional time of analysis and cost of hardware.

Furthermore, in accordance with the present invention, the consistency between paired images is indicated as a correlation. The operator of the electron microscope may check the reliability of the analytic result output. Incorrect operation may be prevented by setting a lower threshold of correlation values so as not to limit the adjustment of the lens system when a calculated correlation value is less than the lower threshold. In an automatic inspection apparatus, the operator may check to see later whether or not the automatic compensation has been performed correctly, by storing the correlation values in the focal analysis and the results of focal analysis, allowing unmanned operation to be performed.

The analysis of displacement in accordance with the present invention is a method making use of the phase component of images, which is almost immune to the variance of background, and is operable if there is a sufficient common area of paired images, even when some extent of shadow of aperture covers the images. The system in accordance with the present invention is still operable when the TEM is not sufficiently configured. In brief, an operator unfamiliar with the operation of TEM may use the system.

The foregoing description of some preferred embodiments of the invention has been presented for purposes of illustration and description. It is not intended to be exhaustive or to limit the invention to the precise forms disclosed, and modifications and variations are possible in light of the above teachings or may be acquired from practice of the invention. The embodiments are chosen and described in order to explain the principles of the invention and its practical application to enable one skilled in the art to utilize the invention in various embodiments and with various modifications as are suited to the particular use contemplated it is intended that the scope of the invention be defined by the claims appended hereto, and their equivalents.

What is claimed is:

1. An electron beam apparatus, comprising:
    a source of charged particle beam;
    a specimen stage for holding a specimen;
    a specimen stage controller for moving the specimen stage;
    a deflector coil for deflecting an incident position of a first charged particle beam into the specimen;
    a detector for detecting a second charged particle beam from the specimen and generating an image signal;
    a computer for obtaining a plurality of images from the image signal to calculate a transfer speed of the specimen; and
    a deflector coil controller for controlling the operation of the deflector coil so as to cancel out the influence of transfer of the specimen stage.

2. An electron beam apparatus according to claim 1, wherein:
    the specimen stage controller moves the specimen stage at a certain velocity; and
    the deflector coil controller controls the deflector coil to shift the second charged particle beam at a substantially same velocity as the specimen stage.

3. An electron beam apparatus according to claim 1, wherein:
    the specimen stage controller stops the specimen stage; and
    the deflector coil controller controls the deflector coil to shift the second charged particle beam so as to cancel out a specimen drift.

4. A method of operating an electron microscope, comprising the steps of:
    placing a specimen on a specimen stage;
    continuously moving the specimen stage;
    irradiating the specimen with a first electron beam;
    taking an image by a second electron beam from the specimen;
    capturing a plurality of taken images for storage;
    performing an image processing on said plurality of taken images to determine a consistency between the plurality of taken images;
    determining an amount of displacement between the plurality of taken images; and
    controlling a deflector coil to deflect the irradiation of the first electron beam to the specimen so as to cancel out the transfer of the specimen stage based on the determined consistency and displacement.

* * * * *